United States Patent
Miki et al.

(10) Patent No.: US 8,227,284 B2
(45) Date of Patent: Jul. 24, 2012

(54) GROUP-III NITRIDE COMPOUND SEMICONDUCTOR LIGHT-EMITTING DEVICE, METHOD OF MANUFACTURING GROUP-III NITRIDE COMPOUND SEMICONDUCTOR LIGHT-EMITTING DEVICE, AND LAMP

(75) Inventors: Hisayuki Miki, Chiba (JP); Kenzo Hanawa, Ichihara (JP); Yasumasa Sasaki, Kamakura (JP)

(73) Assignee: Showa Denko K.K., Tokyo (JP)

( * ) Notice: Subject to any disclaimer, the term of this patent is extended or adjusted under 35 U.S.C. 154(b) by 505 days.

(21) Appl. No.: 12/373,655

(22) PCT Filed: Aug. 15, 2007

(86) PCT No.: PCT/JP2007/065902
§ 371 (c)(1),
(2), (4) Date: Jan. 13, 2009

(87) PCT Pub. No.: WO2008/020599
PCT Pub. Date: Feb. 21, 2008

(65) Prior Publication Data
US 2009/0315046 A1 Dec. 24, 2009

(30) Foreign Application Priority Data

Aug. 18, 2006 (JP) .................. 2006-223260
Aug. 18, 2006 (JP) .................. 2006-223261
Oct. 26, 2006 (JP) .................. 2006-291082

(51) Int. Cl.
*H01L 21/00* (2006.01)
(52) U.S. Cl. ............ 438/47; 257/E33.025; 257/E33.049
(58) Field of Classification Search .................. None
See application file for complete search history.

(56) References Cited

U.S. PATENT DOCUMENTS

| 5,122,845 A | 6/1992 | Manabe et al. |
| 5,290,393 A | 3/1994 | Nakamura |

(Continued)

FOREIGN PATENT DOCUMENTS

JP 60-043482 A 3/1985
(Continued)

OTHER PUBLICATIONS

Y. Ushiku, et al., 21 st Century Joint Symposium of Science Technology and Human, 2003, pp. 295-298, vol. 2.
(Continued)

*Primary Examiner* — Seahvosh Nikmanesh
(74) *Attorney, Agent, or Firm* — Sughrue Mion, PLLC

(57) ABSTRACT

The present invention provides a group-III nitride compound semiconductor light-emitting device having high productivity and good emission characteristics, a method of manufacturing a group-III nitride compound semiconductor light-emitting device, and a lamp. A method of manufacturing a group-III nitride compound semiconductor light-emitting device includes a step of forming on a substrate 11 a semiconductor layer made of a group-III nitride compound semiconductor including Ga as a group-III element using a sputtering method. The substrate 11 and a sputtering target are arranged so as to face each other, and a gap between the substrate 11 and the sputtering target is in the range of 20 to 100 mm. In addition, when the semiconductor layer is formed by the sputtering method, a bias of more than 0.1 W/cm$^2$ is applied to the substrate 11. Further, when the semiconductor layer is formed, nitrogen and argon are supplied into a chamber used for sputtering.

14 Claims, 8 Drawing Sheets

U.S. PATENT DOCUMENTS

| | | | |
|---|---|---|---|
| 6,713,789 B1 | 3/2004 | Shibata et al. | |
| 2001/0012678 A1 | 8/2001 | Tanaka et al. | |
| 2002/0078881 A1* | 6/2002 | Cuomo et al. | 117/84 |
| 2003/0039866 A1 | 2/2003 | Mitamura | |
| 2003/0109076 A1 | 6/2003 | Senda et al. | |

FOREIGN PATENT DOCUMENTS

| | | |
|---|---|---|
| JP | 05-086646 B2 | 9/1985 |
| JP | 3026087 B2 | 9/1990 |
| JP | 04-297023 A | 10/1992 |
| JP | 11-061404 A | 3/1999 |
| JP | 2000-064037 A | 2/2000 |
| JP | 3440873 B2 | 10/2000 |
| JP | 2001-035805 A | 2/2001 |
| JP | 3700492 B2 | 4/2001 |
| JP | 2001-176804 A | 6/2001 |
| JP | 2001-254167 A | 9/2001 |
| JP | 2001-291291 A | 10/2001 |
| JP | 2001-308010 A | 11/2001 |
| JP | 2002-163932 A | 6/2002 |
| JP | 2005-210017 A | 8/2005 |
| JP | 2005-277374 A | 10/2005 |
| JP | 2006-108656 A | 4/2006 |
| KR | 10-2002-0099467 A | 5/2002 |
| KR | 1020020039467 A | 5/2002 |
| KR | 2003-0059299 A | 7/2003 |
| KR | 1020040068013 A | 7/2004 |
| TW | 490866 | 6/2002 |

OTHER PUBLICATIONS

T. Kikuma, et al., "GaN films deposited by planar magnetron sputtering", Vacuum, 2002, pp. 233-237, vol. 66.

Kikuo Tominaga, et al., "AIN Film Preparation on Glass by Sputtering System with Facing Targets", Japanese Journal of Applied Physics, 1989, pp. 7-10, vol. 28, Supplement 28-2.

M. Ishihara, et al., "Control of preferential orientation of AIN films prepared by the reactive sputtering method", Thin Solid Films, 1998, pp. 152-157, vol. 316.

Korean Notice of Preliminary Rejection dated Jun. 28, 2011, in counterpart Korean application 10-2009-7002962.

Decision of Dismissal of Amendment dated Dec. 22, 2011 for corresponding Korean Patent Application No. 10-2009-7002962.

Japanese Office Action dated May 15, 2012 for corresponding Japanese Patent Application No. 2006-223260.

Japanese Office Action dated May 15, 2012 for corresponding Japanese Patent Application No. 2006-22361.

* cited by examiner

GROUP-III NITRIDE COMPOUND SEMICONDUCTOR LIGHT-EMITTING DEVICE, METHOD OF MANUFACTURING GROUP-III NITRIDE COMPOUND SEMICONDUCTOR LIGHT-EMITTING DEVICE, AND LAMP

TECHNICAL FIELD

The present invention relates to a method of manufacturing a group-III nitride compound semiconductor light-emitting device applicable to, for example, a light-emitting diode (LED), a laser diode (LD), or an electronic device, and more particularly, to a group-III nitride compound semiconductor light-emitting device capable of epitaxially growing a group-III nitride compound semiconductor crystal having high crystallinity on a substrate, a method of manufacturing a group-III nitride compound semiconductor light-emitting device, and a lamp.

Priority is claimed on Japanese Patent Applications Nos. 2006-223260 and 2006-223261, filed Aug. 18, 2006, and Japanese Patent Application No. 2006-291082, filed on Oct. 26, 2006, the content of which is incorporated herein by reference.

BACKGROUND ART

A group-III nitride semiconductor light-emitting device has a direct-transition-type energy band gap corresponding to the range from visible light to ultraviolet light, and has high emission efficiency. Therefore, the group-III nitride semiconductor light-emitting device has been used as a light-emitting device, such as an LED or an LD.

When the group-III nitride semiconductor light-emitting device is used for an electronic device, it is possible to obtain an electronic device having better characteristics, as compared to when a group III-V compound semiconductor according to the related art is used.

In general, the group-III nitride compound semiconductor is formed by an MOCVD method using trimethylgallium, trimethylaluminum, and ammonia as raw materials.

In the MOCVD method, a carrier gas including the vapor of a raw material is supplied to the surface of a substrate, and reacts with the heated substrate to be decomposed, thereby growing a crystal.

In general, a single crystal wafer made of a group III-V compound semiconductor is obtained by growing a crystal on a single crystal wafer made of a different material. There is large lattice mismatch between the substrate and a group-III nitride semiconductor crystal epitaxially grown on the substrate. For example, when a gallium nitride (GaN) is grown on a sapphire ($Al_2O_3$) substrate, there is 16% lattice mismatch therebetween. When a gallium nitride is grown on a SiC substrate, there is 6% of lattice mismatch therebetween.

In general, the large lattice mismatch makes it difficult to epitaxially grow a crystal on the substrate directly. Even though the crystal is grown on the substrate, it is difficult to obtain a crystal having high crystallinity.

Therefore, a metal organic chemical vapor deposition (MOCVD) method has been proposed in which, when a group-III nitride semiconductor crystal is epitaxially grown on a sapphire single crystal substrate or a SiC single crystal substrate, a so-called low temperature buffer layer made of aluminum nitride (AlN) or AlGaN is formed on the substrate and a group-III nitride semiconductor crystal is epitaxially grown on the buffer layer at a high temperature (for example, see Patent Documents 1 and 2).

Studies have been conducted which manufacture a group-III nitride compound semiconductor crystal using sputtering. For example, a method has been proposed which forms a GaN film on the Si (100) plane and the $Al_2O_3$ (0001) plane using a radio frequency magnetron sputtering method using $N_2$ gas (for example, see Non-Patent Document 1). In the method disclosed in Non-Patent Document 1, the deposition conditions are as follows: an overall gas pressure of 2 mTorr; a power of 100 W; and a substrate temperature in the range of RT to 900° C. In addition, a sputtering apparatus in which a target and a substrate are arranged so as to face each other is used.

In addition, a method has been proposed which forms a GaN film using an apparatus in which a cathode and a target are arranged so as to face each other and a mesh is interposed between a substrate and the target (for example, see Non-Patent Document 2).

In the method disclosed in Non-Patent Document 2, the deposition conditions are as follows: a pressure of 0.67 Pa in $N_2$ gas; a substrate temperature in the range of 84° C. to 600° C.; a power of 150 W; and a gap of 80 mm between the substrate and the target.

Further, a method has been proposed which forms an AlN film on a substrate in a so-called opposite cathode manner in which targets face each other (for example, see Non-Patent Document 3).

Furthermore, a method of forming an AlN film on a substrate using DC magnetron sputtering has been proposed (for example, Non-Patent Document 4). In the method disclosed in Non-Patent Document 4, the substrate faces the target, and sputtering is performed in a mixed gas atmosphere of Ar and $N_2$ under the following deposition conditions: a pressure in the range of 0.2 to 0.8 Pa and a distance in the range of 60 to 180 mm between the substrate and the target.

Further, as a method of forming an AlN layer as a buffer layer using deposition methods other than an MOCVD method and forming a layer on the buffer layer using the MOCVD method, for example, a method has been proposed which forms a buffer layer using an RF sputtering method and grows on the buffer layer a crystal having the same composition as the buffer layer using an MOCVD method (for example, Patent Document 3). However, in the method disclosed in Patent Document 3, it is difficult to obtain a stable and good crystal (see Patent Documents 4 and 5).

Therefore, in order to obtain a stable and good crystal, for example, the following methods have been proposed: a method of forming a buffer layer and performing annealing in a mixed gas atmosphere of ammonia and hydrogen (for example, Patent Document 4); and a method of forming a buffer layer at a temperature of more than 400° C. using DC sputtering (for example, Patent Document 5).

In the methods disclosed in Patent Documents 4 and 5, a substrate is formed of sapphire, silicon, silicon carbide, zinc oxide, gallium phosphide, gallium arsenide, magnesium oxide, manganese oxide, or a group-III nitride compound semiconductor single crystal. Among these materials, an a-plane sapphire substrate is preferable.

[Patent Document 1] Japanese Patent No. 3026087
[Patent Document 2] JP-A-4-297023
[Patent Document 3] JP-B-5-86646
[Patent Document 4] Japanese Patent No. 3440873
[Patent Document 5] Japanese Patent No. 3700492
[Non-Patent Document 1] Y. USHIKU, et al., "Proceedings of the 21st Century Combined Symposium", Vol. 2, p. 295 (2003)
[Non-Patent Document 2] T. Kikuma, et al., "Vacuum", Vol. 66, p. 233 (2002)

[Non-Patent Document 3] Kikuo Tominaga, et al., "Japanese Journal of Applied Physics", Vol. 28, p. 7 (1989)

[Non-Patent Document 4] M. Ishihara, et al., "Thin Solid Films", Vol. 316, p 152 (1998)

However, the inventors' experiments proved that, when deposition was performed under the conditions disclosed in Patent Documents 4 and 5, it was difficult to obtain a stable and good crystal using a group-III nitride compound semiconductor including Ga as a group-III element. That is, in the methods disclosed in Patent Documents 4 and 5, an MOCVD method is used to form a GaN layer on the buffer layer formed by a sputtering method. When the buffer layer is formed by the sputtering method, deposition rate is high, but the crystallinity of the buffer layer is likely to deteriorate depending on the deposition conditions. When the GaN layer is formed on the buffer layer having low crystallinity by the MOCVD method, there is a concern that the crystallinity of the GaN layer will be greatly reduced.

When a GaN layer is formed by a sputtering method under the conditions disclosed in Non-Patent Documents 1 and 2, it is difficult to form a GaN layer having high crystallinity on the buffer layer.

The present invention has been made in order to solve the above-mentioned problems, and an object of the present invention is to provide a group-III nitride compound semiconductor light-emitting device that is capable of stably forming a crystal film made of a uniform group-III nitride compound semiconductor in a short time and has high productivity and good emission characteristics, a method of manufacturing a group-III nitride compound semiconductor light-emitting device, and a lamp.

The inventors have conducted studies to solve the above-mentioned problems, thereby achieving the present invention.

That is, the present invention is as follows.

According to a first aspect of the present invention, a method of manufacturing a group-III nitride compound semiconductor light-emitting device includes a step of forming on a substrate a semiconductor layer made of a group-III nitride compound semiconductor including Ga as a group-III element using a sputtering method. The substrate and a sputtering target are arranged so as to face each other, and a gap between the substrate and the sputtering target is in the range of 20 to 100 mm.

According to a second aspect of the present invention, a method of manufacturing a group-III nitride compound semiconductor light-emitting device includes a step of forming on a substrate a semiconductor layer made of a group-III nitride compound semiconductor including Ga as a group-III element using a sputtering method. When the semiconductor layer is formed, power is supplied to a sputtering target by a radio frequency power supply or a pulsed DC power supply.

According to a third aspect of the present invention, a method of manufacturing a group-III nitride compound semiconductor light-emitting device includes a step of forming on a substrate a semiconductor layer made of a group-III nitride compound semiconductor including Ga as a group-III element using a sputtering method. When the semiconductor layer is formed, the pressure of a chamber for sputtering is set to be lower than $1.0 \times 10^{-3}$ Pa in advance, and a raw material is supplied into the chamber.

According to a fourth aspect of the present invention, a method of manufacturing a group-III nitride compound semiconductor light-emitting device includes a step of forming on a substrate a semiconductor layer made of a group-III nitride compound semiconductor including Ga as a group-III element using a sputtering method. The substrate and a sputtering target are arranged so as to face each other.

According to a fifth aspect of the present invention, a method of manufacturing a group-III nitride compound semiconductor light-emitting device includes a step of forming on a substrate a semiconductor layer made of a group-III nitride compound semiconductor including Ga as a group-III element using a sputtering method. When the semiconductor layer is formed, a magnetic field is swinged or rotated with respect to a sputtering target.

According to a sixth aspect of the present invention, in the method of manufacturing a group-III nitride compound semiconductor light-emitting device according to any one of the first to fifth aspects, preferably, the semiconductor layer is formed by a reactive sputtering method that introduces a nitride raw material into a reactor.

According to a seventh aspect of the present invention, in the method of manufacturing a group-III nitride compound semiconductor light-emitting device according to the sixth aspect, preferably, nitrogen is used as the nitride raw material.

According to an eighth aspect of the present invention, in the method of manufacturing a group-III nitride compound semiconductor light-emitting device according to any one of the first to seventh aspects, preferably, a buffer layer made of a columnar crystal is formed between the substrate and the semiconductor layer.

According to a ninth aspect of the present invention, in the method of manufacturing a group-III nitride compound semiconductor light-emitting device according to the eighth aspect, preferably, the buffer layer is formed by the sputtering method.

According to a tenth aspect of the present invention, in the method of manufacturing a group-III nitride compound semiconductor light-emitting device according to the eighth or ninth aspect, preferably, the buffer layer is formed of a group-III nitride compound including Al as a group-III element.

According to an eleventh aspect of the present invention, in the method of manufacturing a group-III nitride compound semiconductor light-emitting device according to the tenth aspect, preferably, the buffer layer is formed of AlN.

According to a twelfth aspect of the present invention, in the method of manufacturing a group-III nitride compound semiconductor light-emitting device according to any one of the eighth to eleventh aspects, preferably, the buffer layer is formed so as to cover 90% or more of the front surface of the substrate.

According to a thirteenth aspect of the present invention, in the method of manufacturing a group-III nitride compound semiconductor light-emitting device according to any one of the eighth to twelfth aspects, preferably, the width of the columnar crystal forming the buffer layer is in the range of 0.1 to 100 nm.

According to a fourteenth aspect of the present invention, in the method of manufacturing a group-III nitride compound semiconductor light-emitting device according to any one of the eighth to thirteenth aspects, preferably, the thickness of the buffer layer is in the range of 10 to 500 nm.

According to a fifteenth aspect of the present invention, in the method of manufacturing a group-III nitride compound semiconductor light-emitting device according to any one of the eighth to fourteenth aspects, preferably, the buffer layer is formed of AlN, and the semiconductor layer made of the group-III nitride compound is formed of GaN.

According to a sixteenth aspect of the present invention, in the method of manufacturing a group-III nitride compound semiconductor light-emitting device according to any one of the first to fifteenth aspects, preferably, the substrate is formed of sapphire.

According to a seventeenth aspect of the present invention, a group-III nitride compound semiconductor light-emitting device is manufactured by the manufacturing method according to any one of the first to sixteenth aspects.

According to an eighteenth aspect of the present invention, a lamp includes the group-III nitride compound semiconductor light-emitting device according to the seventeenth aspect.

According to a nineteenth aspect of the present invention, a method of manufacturing a group-III nitride compound semiconductor light-emitting device includes a step of forming on a substrate a semiconductor layer made of a group-III nitride compound semiconductor including Ga as a group-III element using a sputtering method. When the semiconductor layer is formed by the sputtering method, a bias of not less than $0.1$ W/cm$^2$ is applied to the substrate.

According to a twentieth aspect of the present invention, a method of manufacturing a group-III nitride compound semiconductor light-emitting device includes a step of forming on a substrate a semiconductor layer made of a group-III nitride compound semiconductor including Ga as a group-III element using a sputtering method. When the semiconductor layer is formed by the sputtering method, power supplied to a sputtering target is in the range of $0.1$ W/cm$^2$ to $100$ W/cm$^2$.

According to a twenty-first aspect of the present invention, in the method of manufacturing a group-III nitride compound semiconductor light-emitting device according to the nineteenth or twentieth aspect, preferably, the semiconductor layer is formed by a reactive sputtering method that introduces a nitride raw material into a reactor.

According to a twenty-second aspect of the present invention, in the method of manufacturing a group-III nitride compound semiconductor light-emitting device according to the twenty-first aspect, preferably, nitrogen is used as the nitride raw material.

According to a twenty-third aspect of the present invention, in the method of manufacturing a group-III nitride compound semiconductor light-emitting device according to any one of the nineteenth to twenty-second aspects, preferably, a buffer layer made of a columnar crystal is formed between the substrate and the semiconductor layer.

According to a twenty-fourth aspect of the present invention, in the method of manufacturing a group-III nitride compound semiconductor light-emitting device according to the twenty-third aspect, preferably, the buffer layer is formed by the sputtering method.

According to a twenty-fifth aspect of the present invention, in the method of manufacturing a group-III nitride compound semiconductor light-emitting device according to the twenty-fourth aspect, preferably, the buffer layer is formed of a group-III nitride compound including Al.

According to a twenty-sixth aspect of the present invention, in the method of manufacturing a group-III nitride compound semiconductor light-emitting device according to the twenty-fifth aspect, preferably, the buffer layer is formed of AlN.

According to a twenty-seventh aspect of the present invention, in the method of manufacturing a group-III nitride compound semiconductor light-emitting device according to any one of the twenty-third to twenty-sixth aspects, preferably, the buffer layer is formed so as to cover 90% or more of the front surface of the substrate.

According to a twenty-eighth aspect of the present invention, in the method of manufacturing a group-III nitride compound semiconductor light-emitting device according to any one of the twenty-third to twenty-seventh aspects, preferably, the width of the columnar crystal forming the buffer layer is in the range of $0.1$ to $100$ nm.

According to a twenty-ninth aspect of the present invention, in the method of manufacturing a group-III nitride compound semiconductor light-emitting device according to any one of the twenty-third to twenty-eighth aspects, preferably, the thickness of the buffer layer is in the range of $10$ to $500$ nm.

According to a thirtieth aspect of the present invention, in the method of manufacturing a group-III nitride compound semiconductor light-emitting device according to any one of the twenty-third to twenty-ninth aspects, preferably, the buffer layer is formed of AlN, and the semiconductor layer made of the group-III nitride compound is formed of GaN.

According to a thirty-first aspect of the present invention, in the method of manufacturing a group-III nitride compound semiconductor light-emitting device according to any one of the nineteenth to thirtieth aspects, preferably, the substrate is formed of sapphire.

According to a thirty-second aspect of the present invention, a group-III nitride compound semiconductor light-emitting device is manufactured by the manufacturing method according to any one of the nineteenth to thirty-first aspects.

According to a thirty-third aspect of the present invention, a lamp includes the group-III nitride compound semiconductor light-emitting device according to the thirty-second aspect.

According to a method of manufacturing a group-III nitride compound semiconductor light-emitting device of the present invention, it is possible to form a uniform crystal film in a short time using a sputtering method. In this way, it is possible to stably form a group-III nitride compound semiconductor layer having high crystallinity. As a result, it is possible to obtain a group-III nitride compound semiconductor light-emitting device having high productivity and good emission characteristics.

Figure 1:
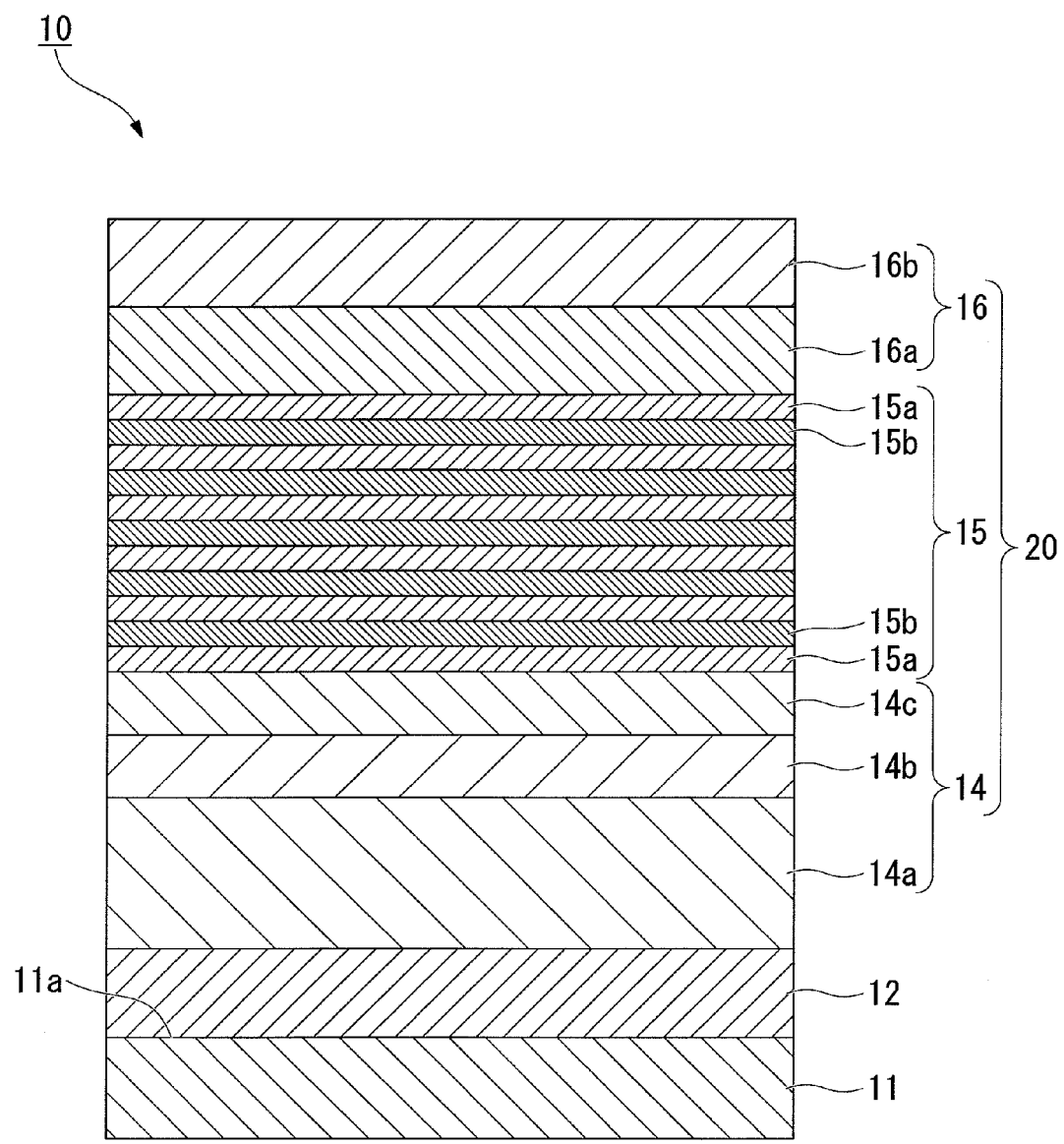
FIG. 1 is a cross-sectional view schematically illustrating an example of the structure of a laminated semiconductor of a group-III nitride compound semiconductor light-emitting device according to the present invention.

BEST MODE FOR CARRYING OUT THE INVENTION (First Embodiment)

Hereinafter, a group-III nitride compound semiconductor light-emitting device, a method of manufacturing a group-III nitride compound semiconductor light-emitting device, and a lamp according to an embodiment of the present invention will be described with reference to FIGS. 1 to 7.

The method of manufacturing a group-III nitride compound semiconductor light-emitting device (hereinafter, simply referred to as a light-emitting device) according to this embodiment includes a process of forming on a substrate semiconductor layers each made of a group-III nitride compound semiconductor using at least a sputtering method, and a compound including Ga is used as the group-III nitride compound semiconductor.

A laminated structure of a light-emitting device obtained by the manufacturing method according to this embodiment will be described using a laminated semiconductor 10 shown in FIG. 1. In the laminated semiconductor 10, a buffer layer 12 made of a group-III nitride compound is formed on a substrate 11, and a semiconductor layer 20 including an n-type semiconductor layer 14, a light-emitting layer 15, and a p-type semiconductor layer 16 in this order is formed on the buffer layer 12.

Figure 2:
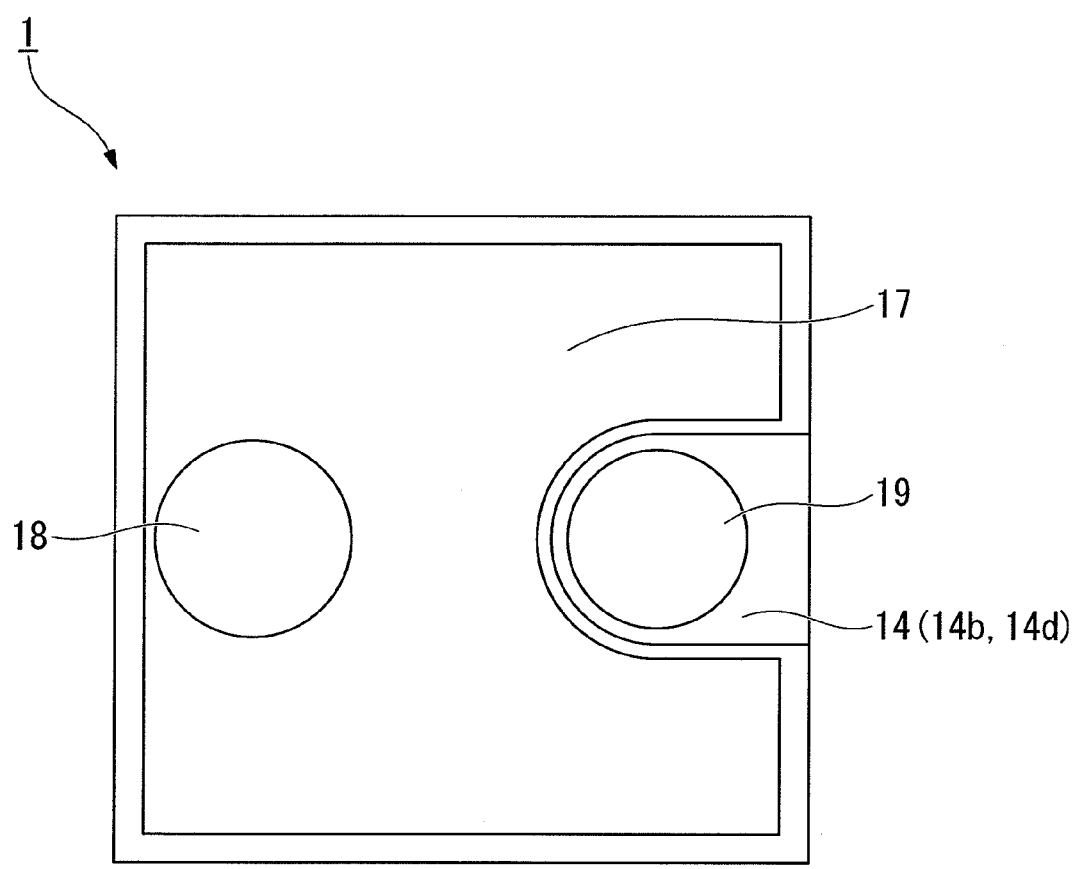
FIG. 2 is a plan view schematically illustrating an example of the structure of the group-III nitride compound semiconductor light-emitting device according to the present invention.
Figure 3:
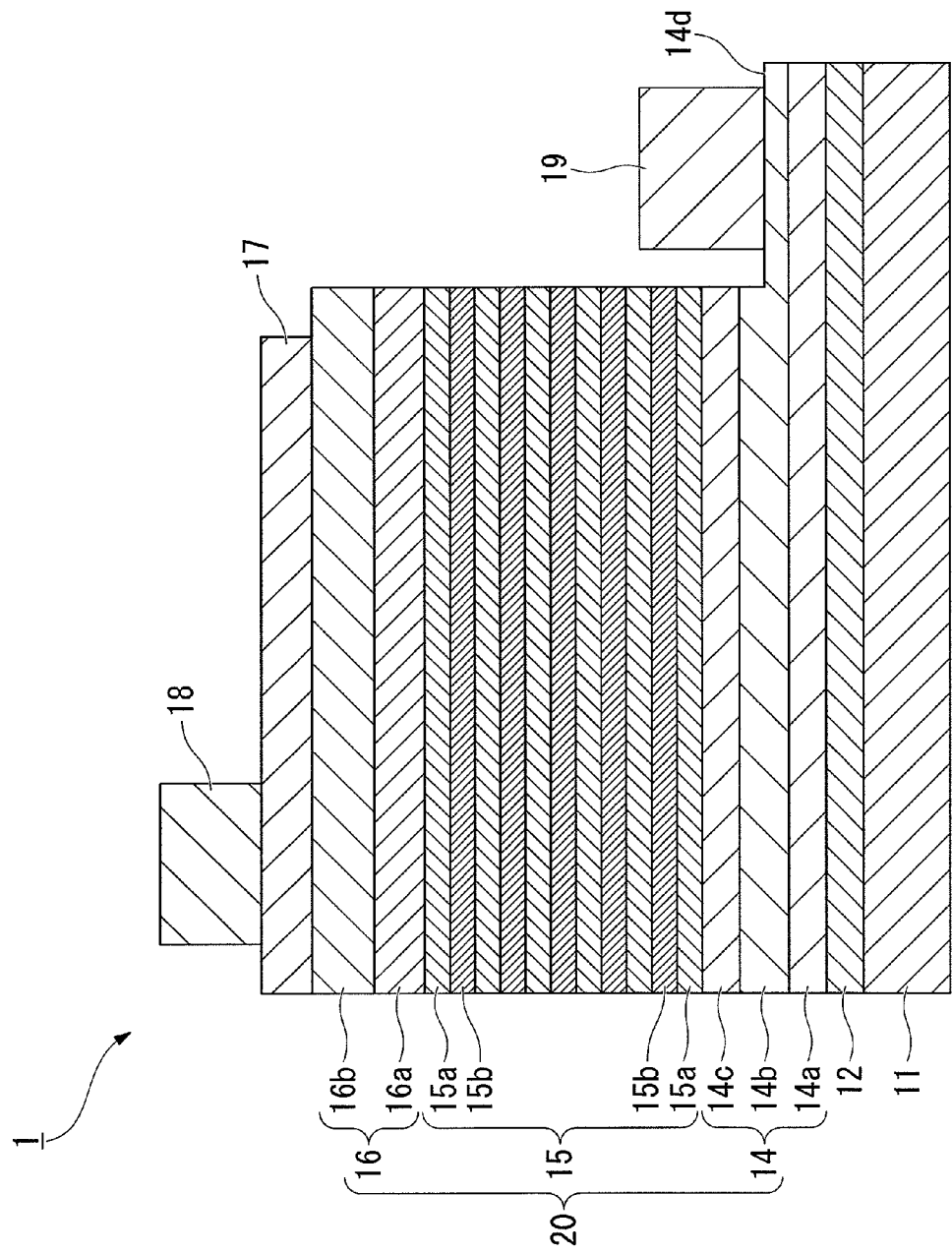
FIG. 3 is a cross-sectional view schematically illustrating an example of the laminated structure of the group-III nitride compound semiconductor light-emitting device according to the present invention.

As shown in FIGS. 2 and 3, a translucent positive electrode 17 is formed on the p-type semiconductor layer 16 of the laminated semiconductor 10 according to this embodiment, and a positive electrode bonding pad 18 is formed on the translucent positive electrode. In addition, an exposed region 14d is formed in an n-type contact layer 14b of the n-type semiconductor layer 14, and a negative electrode 19 is formed on the exposed region 14d. In this way, a light-emitting device 1 is formed.

[Deposition of Semiconductor Layer Using Sputtering Method]

In the method of manufacturing a light-emitting device according to the present invention, as described above, the layers forming the semiconductor layer 20 are formed on the substrate 11 by at least a sputtering method. In this embodiment, an underlying layer 14a and the n-type contact layer 14b of the n-type semiconductor layer 14 in the semiconductor layer 20 are formed by the sputtering method.

In order to form a group-III nitride compound semiconductor having high crystallinity on a substrate using a sputtering method, it is necessary to generate a reactive species having high energy to activate migration on the substrate. Therefore, in this embodiment, the following method is used.

It is preferable that RF (radio frequency) sputtering or DC sputtering be used as sputtering used in the manufacturing method according to this embodiment to supply power to a sputtering target.

In general, when reactive sputtering, which will be described below, is used, the RF sputtering is preferable since it can easily control deposition rate.

In the DC sputtering, when reactive sputtering is used and a DC voltage is continuously applied, a sputtering target is charged up, and it is difficult to increase the deposition rate. Therefore, it is preferable to use a pulsed DC sputtering method that applies a pulse bias.

When a semiconductor layer is formed by the sputtering method, it is preferable to use a reactive sputtering method that introduces a nitride raw material into a reactor since it can control reaction to maintain high crystallinity and stably reproduce high crystallinity.

Further, in this embodiment, when the sputtering method is used to form the semiconductor layer, it is preferable to rotate or swing a magnetic field applied to a metal target 47.

In particular, when the RF sputter is used, it is preferable to perform deposition while moving the position of a magnet in a target (sputtering target) in order to prevent charge-up.

A method of moving the magnet depends on the kind of sputtering apparatus. For example, it is possible to swing or rotate the magnet.

In the sputtering apparatus 40 shown in FIG. 7, a magnet 42 is provided below the metal target (sputtering target) 47 (a lower side in FIG. 7), and the magnet 42 is swung along a target table 43 below the metal target 47 by a driving device (not shown). A nitrogen gas and an argon gas are supplied into the chamber 41, and a semiconductor layer is formed on the substrate 11 to which a heater 44 is attached by the sputtering method.

Figure 8:
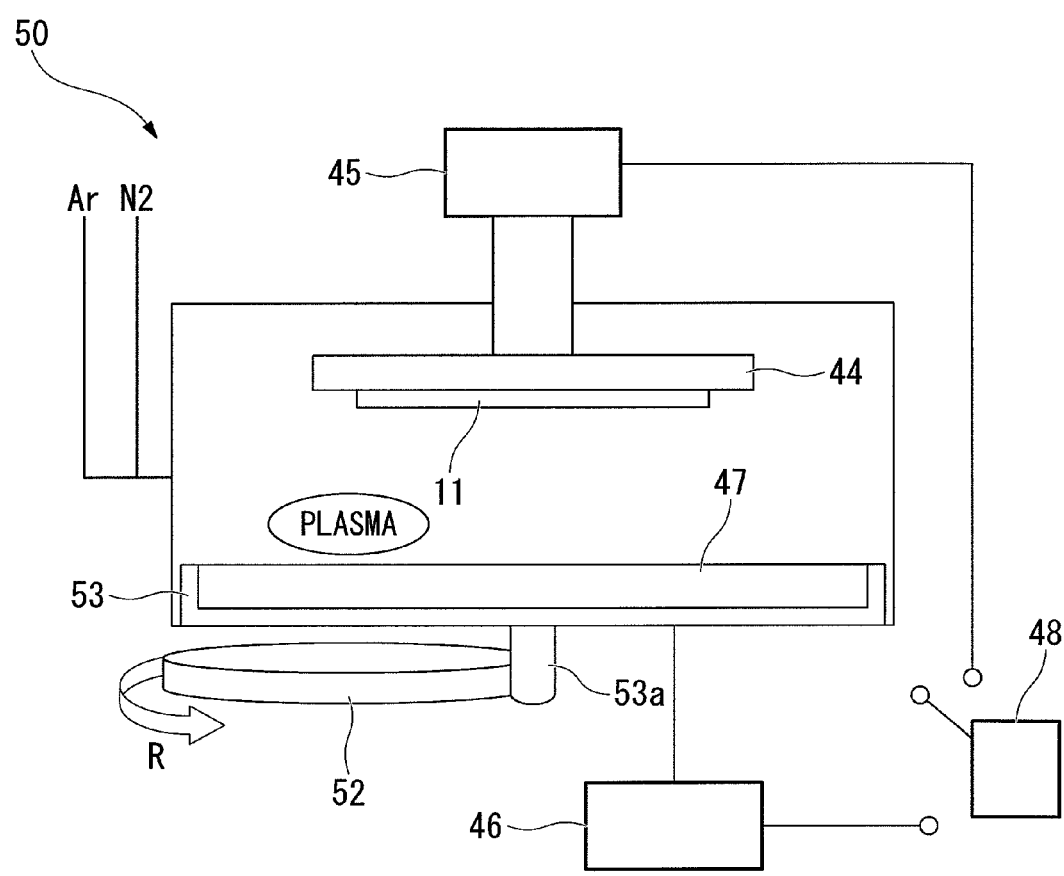
FIG. 8 is a diagram schematically illustrating another example of the method of manufacturing the group-III nitride compound semiconductor light-emitting device according to the present invention, and shows the schematic structure of a rotary sputtering apparatus.

In a sputtering apparatus 50 shown in FIG. 8, an elliptical magnet 52 is provided below a metal target 47 (a lower side in FIG. 8), and the magnet 52 is rotated about a shaft 53a of a circular target table 53 having the metal target 47 accommodated therein, below the metal target 47 (in the direction of an arrow R in FIG. 8).

In this case, the magnet 52 is rotated below the metal target 47 while confining plasma with a magnetic field generated by the magnet 52. The plasma rotates along the front surface of the metal target 47, and it is possible to use the entire metal target 47.

In addition, it is possible to prevent the front surface of the metal target 47 from being covered with a reaction product, and sputtered particles are ejected from the metal target 47 to the substrate 11 in all directions. Therefore, the sputtered particles are effectively adhered to the substrate 11.

In this embodiment, important parameters in the deposition using the sputtering method are, for example, the internal pressure of the furnace, the partial pressure of nitrogen, the deposition rate, the substrate temperature, and the bias.

In the manufacturing method according to this embodiment, when the semiconductor layer 20 is formed, it is preferable to set the degree of vacuum of the chamber 41 of the sputtering apparatus 40 to be lower than $1.0 \times 10^{-3}$ Pa, and supply a raw material into the chamber 41.

When the degree of vacuum of the chamber 41 of the sputtering apparatus 40 is set in the above-mentioned range, the internal pressure of the chamber 41 is lowered, and the amount of dopant in the chamber 41 is reduced. In this state, a raw material is supplied into the chamber 41 to form the semiconductor layer 20. In this way, it is possible to obtain the semiconductor layer 20 having high crystallinity without a mixture of dopants.

In the sputtering method, it is preferable that the internal pressure of the chamber 41 when the semiconductor layer 20 is formed be higher than or equal to 0.3 Pa. If the internal pressure of the chamber 41 is lower than 0.3 Pa, the amount of nitrogen is excessively small, and there is a concern that the sputtering metal without being nitrified will be adhered to the substrate 11. The upper limit of the internal pressure of the chamber 41 is not particularly limited, but the chamber needs to have a sufficient internal pressure to generate plasma.

It is preferable that the ratio of the flow rate of nitrogen ($N_2$) to the flow rate of Ar be in the range of 20% to 98%. If the ratio between the flow rates is lower than the above-mentioned range, a sputtering metal, not sputtered particles, is adhered to the substrate. On the other hand, when the ratio between the flow rates is higher than the above-mentioned range, the amount of Ar is excessively small, and the sputtering rate is lowered.

It is more preferable that the ratio of the flow rate of nitrogen ($N_2$) to the flow rate of Ar be in the range of 25% to 90%.

In the manufacturing method according to this embodiment, as described above, the concentration of nitrogen in the gas in the chamber of the sputtering apparatus is increased, and Ar, which is a heavy gas, is mixed with nitrogen at the above-mentioned flow ratio. If there is only nitrogen in the chamber, impact against the metal target 47 is weak, and the deposition rate is limited. However, in this embodiment, it is possible to improve the deposition rate and activate migration on the substrate 11 by mixing Ar, which is a heavy gas, with nitrogen at the above-mentioned flow ratio.

As a nitrogen raw material used in this embodiment, a general nitrogen compound may be used. However, it is preferable to use ammonia or nitrogen ($N_2$) since it is easy to treat and is relatively inexpensive.

Ammonia has high decomposition efficiency and can be deposited at a high deposition rate. However, the ammonia has high reactivity and toxicity. Therefore, the ammonia requires a detoxification facility or a gas detector, and it is necessary that a member used for a reactor be made of a material having high chemical stability. When nitrogen ($N_2$) is used as a raw material, a simple apparatus can be used, but it is difficult to obtain a high reaction rate. However, when a method of decomposing nitrogen with, for example, an electric field or heat and introducing it into an apparatus is used, it is possible to obtain a deposition rate that is sufficient for industrial manufacture but is lower than that when ammonia is used. Therefore, nitrogen is most preferable in terms of manufacturing costs.

When the sputtering method is used, the deposition rate is preferably in the range of 0.01 nm/s to 10 nm/s. If the deposition rate is lower than 0.01 nm/s, it takes a long time to perform a deposition process, and manufacturing yield is reduced. If the deposition rate is higher than 10 nm/s, it is difficult to obtain a good film.

In the manufacturing method according to this embodiment, at least a sputtering method is used to form the underlying layer 14a and the n-type contact layer 14b of the n-type semiconductor layer 14 in the semiconductor layer 20. Therefore, it is possible to increase the deposition rate and reduce the deposition (manufacturing) time. The reduction in the manufacturing time makes it possible to minimize the introduction of impurities into the chamber of the sputtering apparatus.

It is preferable that a wet pre-process be performed on the substrate 11. For example, a known RCA cleaning method is performed on the substrate 11 made of silicon to hydrogen-terminate the front surface of the substrate. In this way, the deposition process is stabilized.

In addition, after the substrate 11 is introduced into a reactor, it is possible to perform a pre-process on the substrate using, for example, a sputtering method, before the buffer layer 12 is formed. Specifically, it is possible to arrange the front surface of the substrate 11 by exposing the substrate in Ar or $N_2$ plasma. For example, it is possible to remove an organic material or an oxide adhered to the front surface of the substrate 11 by exposing the front surface of the substrate 11 in, for example, Ar gas or $N_2$ gas plasma. In this case, when a voltage is applied between the substrate 11 and the chamber, plasma particles effectively act on the substrate 11.

The inventors' experiments proved that the temperature of the substrate 11 was preferably in the range of room temperature to 1200° C., more preferably, in the range of 300 to 1000° C., and most preferably, in the range of 500 to 800° C. during deposition.

If the temperature of the substrate 11 is lower than the lower limit, migration on the substrate 11 is prevented, and it is difficult to form a group-III nitride compound semiconductor crystal with high crystallinity. If the temperature of the substrate 11 is higher than the upper limit, there is a concern that the group-III nitride compound semiconductor crystal will be decomposed.

The room temperature described in the present invention is affected by the manufacturing environment, and is generally in the range of 0 to 30° C.

In the manufacturing method according to this embodiment, during a deposition process using a sputtering method, the above-mentioned temperature range of the substrate 11, which is a high temperature range, makes it possible to activate the migration of a reactive species (metal particles ejected from the metal target 47) reaching the substrate 11 on the crystal surface.

In order to deposit a mixed crystal using a sputtering method, any of the following methods may be used: a method of preparing a metal target made of a mixture of metal materials (an alloy is not necessarily formed) in advance; and a method of preparing two targets made of different materials and sputtering the targets at the same time.

For example, when a film having a predetermined composition is formed, a target made of a mixture of materials may be used. When several films having different compositions are formed, a plurality of targets may be provided in the chamber.

In the manufacturing method according to this embodiment, the substrate 11 is arranged so as to face the metal target (sputtering target) 47 and a gap between the substrate 11 and the metal target 47 is preferably set in the range of 20 to 100 mm, a more preferably, 30 to 50 mm.

When the gap between the substrate 11 and the metal target 47 is set in the above-mentioned range, it is possible to supply a reactive species with high energy to the substrate 11 to activate migration on the substrate, thereby forming a group-III nitride compound semiconductor having high crystallinity.

In the manufacturing method according to this embodiment, it is preferable that the substrate 11 be positioned so as to face the metal target 47.

As described above, it is possible to supply high energy to the substrate 11 by arranging the substrate 11 in the plasma in the chamber 41 of the sputtering apparatus 40. As a result, migration on the substrate 11 is activated, and it is easy to form a dislocation loop.

In this way, it is possible to form a group-III nitride compound semiconductor having high crystallinity.

In the manufacturing method according to this embodiment, under the above-mentioned conditions, at least a sputtering method is used to form the underlying layer 14a and the n-type contact layer 14b of the n-type semiconductor layer 14 in the semiconductor layer 20. In this way, it is possible to generate a reactive species having a high bias or high power and supply the reactive species to the substrate 11 with high energy. Therefore, the migration on the substrate 11 is activated, and a dislocation loop is easily formed. In this way, the underlying layer 14a of the n-type semiconductor layer 14 in the semiconductor layer 20 does not succeed to the crystallinity of the buffer layer 12, which is an aggregate of columnar crystals formed on the substrate 11. Therefore, deposition efficiency is improved, and high productivity is obtained. In addition, it is possible to form a group-III nitride compound semiconductor having high crystallinity.

[Laminated Structure of Light-Emitting Device]

Next, the structure of the light-emitting device 1 obtained by the manufacturing method according to this embodiment that uses at least a sputtering method to form the semiconductor layer 20 on the substrate 11 will be described in detail.

<Substrate>

In this embodiment, the substrate 11 may be formed of any material as long as a group-III nitride compound semiconductor crystal can be epitaxially grown on the surface of the substrate. For example, the substrate may be formed of any of the following materials: sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, and molybdenum.

When a buffer layer is formed without using ammonia, an underlying layer on which an n-type semiconductor layer, which will be described below, is formed by a method of using ammonia, and an oxide substrate or a metal substrate made of a material that contacts ammonia at a high temperature to be chemically modified among the substrate materials is used, the buffer layer according to this embodiment also serves as a coating layer. Therefore, this structure is effective in preventing the chemical modification of the substrate.

In general, the sputtering method can reduce the temperature of the substrate. Therefore, even when the substrate is made of a material that is likely to be decomposed at a high temperature, the sputtering method can form various layers on the substrate without damaging the substrate 11.

<Buffer Layer>

In the laminated semiconductor 10 according to this embodiment, the buffer layer 12 made of a group-III nitride compound is formed on the substrate 11 by the sputtering method. The buffer layer 12 is formed by the sputtering method that activates the reaction between a metal raw material and gas including a group-V element in plasma.

In the laminated semiconductor 10 of the group-III nitride compound semiconductor light-emitting device 1 according to this embodiment, when a group-III nitride compound semiconductor crystal is epitaxially grown on the substrate 11, the buffer layer 12, which is an aggregate of columnar crystals, is formed by the sputtering method that activate the reaction between a group-III metal raw material and gas including a nitrogen element in plasma, and the underlying layer 14a and the n-type contact layer 14b of the n-type semiconductor layer 14 are formed on the buffer layer by the sputtering method.

The crystal of the group-III nitride compound semiconductor has a hexagonal crystal structure, and is likely to form a texture having a hexagonal column as a base. In particular, a film formed by a deposition method using metallic plasma is more likely to have a columnar crystal. The columnar crystal described in the present invention has a crystal grain boundary formed between adjacent crystal grains and has a columnar shape in a longitudinal section view.

Figure 5:
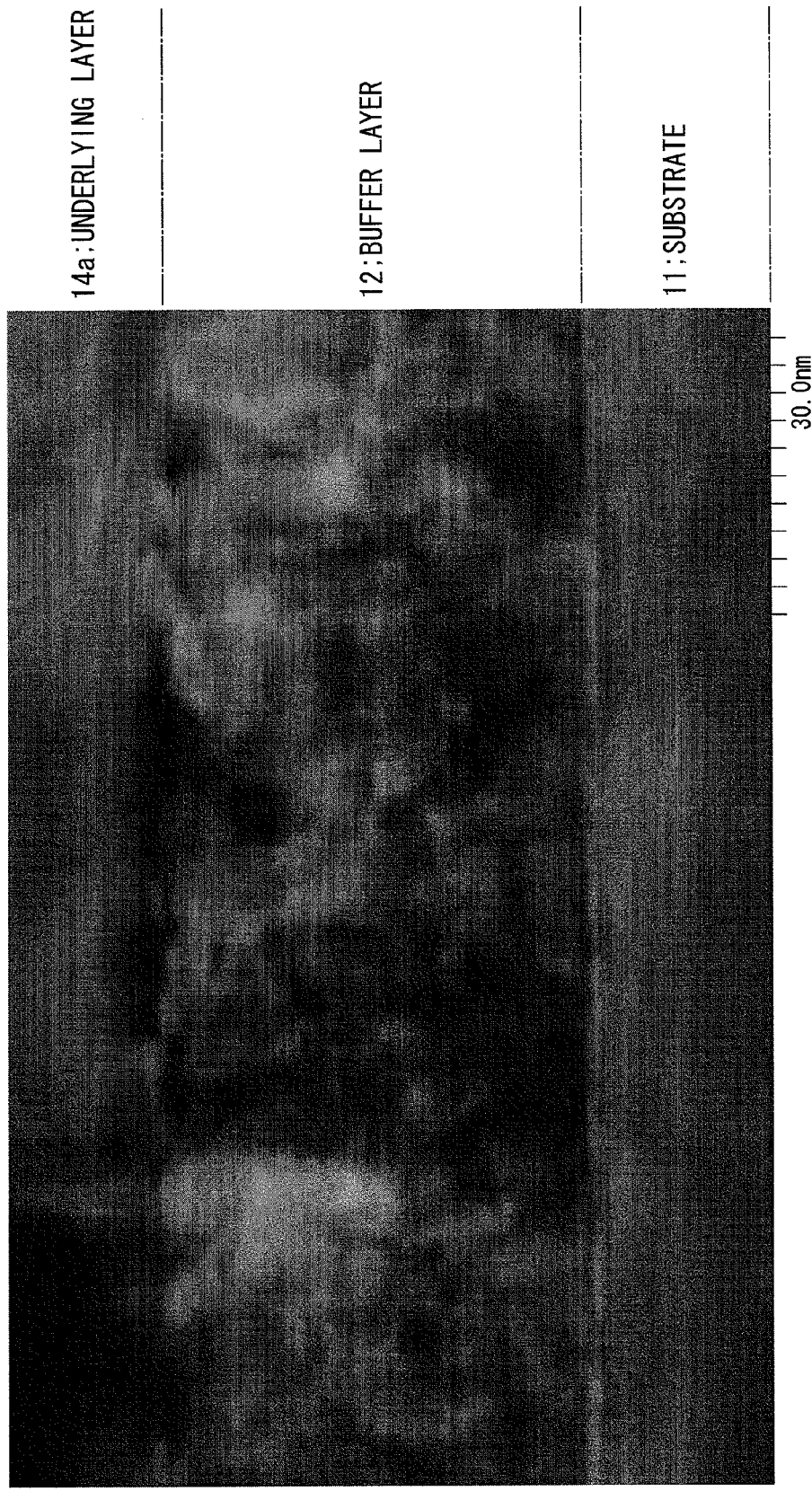
FIG. 5 is a transmission electron microscope (TEM) photograph schematically illustrating an example of the section structure of the group-III nitride compound semiconductor light-emitting device according to the present invention.
Figure 6:
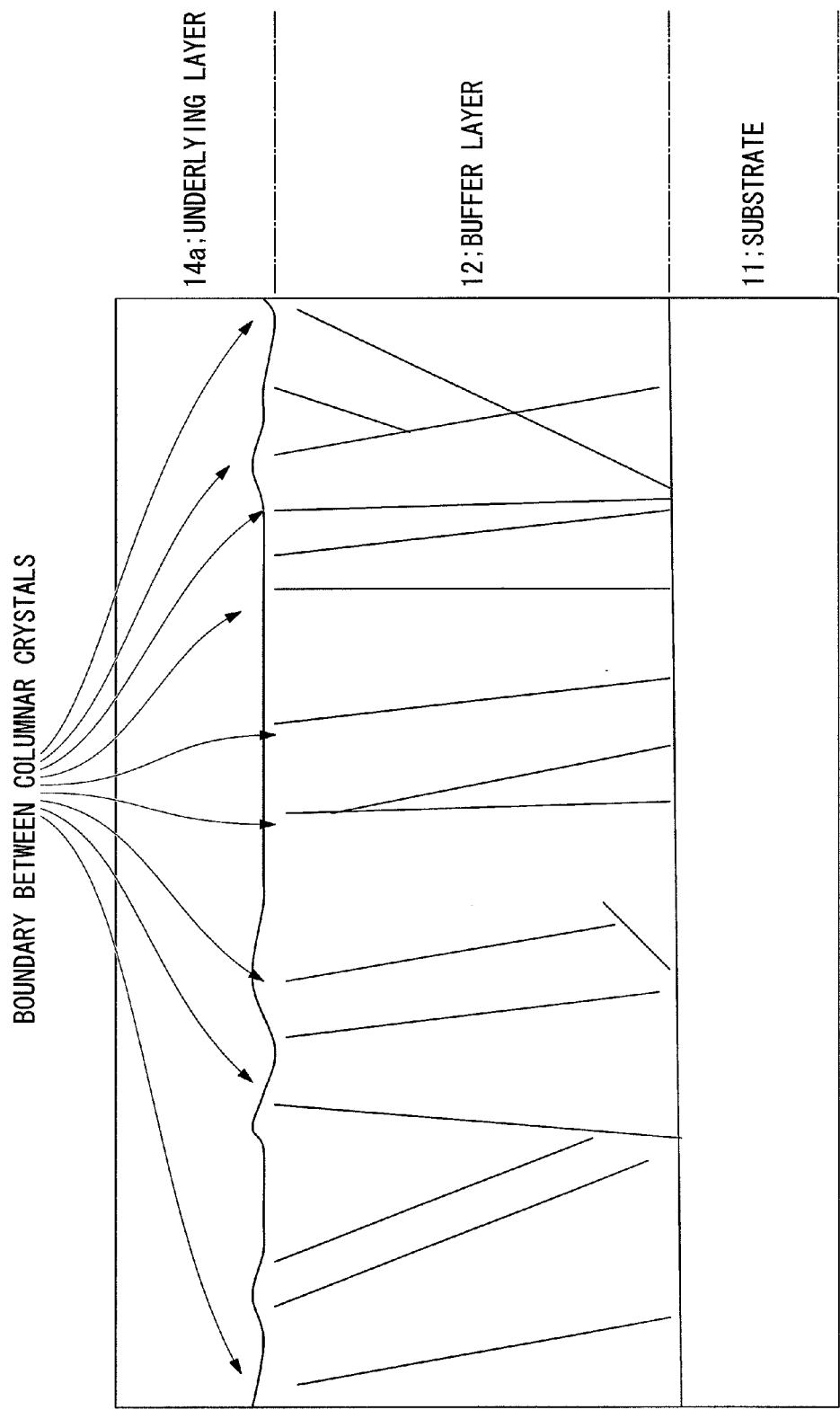
FIG. 6 is a diagram schematically illustrating an example of the group-III nitride compound semiconductor light-emitting device according to the present invention, and schematically shows the TEM photograph shown in FIG. 5.

FIG. 5 is a transmission electron microscope (TEM) photograph showing the cross-section of a group-III nitride compound semiconductor laminated structure according to Example 1, and FIG. 6 is a schematic diagram of FIG. 5. The buffer layer 12 is partitioned by boundaries represented by solid lines in FIG. 6, and the shape of each crystal between the boundaries is a hexagonal cylinder. In the present invention, the crystal shape is referred to as an aggregate of columnar crystals. As can be seen from FIGS. 5 and 6, the crystal shape is also referred to as a layer partitioned at the boundary. In the present invention, an aggregate of columnar crystals also includes the layer.

When the buffer layer 12 including the columnar crystals is formed on the substrate 11, the semiconductor layer that is made of a group-III nitride compound semiconductor and formed on the buffer layer becomes a crystal film having high crystallinity.

The buffer layer 12 needs to cover 60% or more, preferably, 80% or more, and more preferably, 90% or more of the front surface 11a of the substrate 11.

In addition, it is most preferable that the buffer layer 12 be formed so as to cover 100% of the front surface 11a, that is, the entire front surface 11a of the substrate 11 without any gap.

When the area of the buffer layer 12 covering the front surface 11a of the substrate 11 is reduced, a large area of the substrate 11 is exposed, and the underlying layer 14a formed on the buffer layer 12 and the underlying layer 14a directly formed on the substrate 11 have different lattice constants. Therefore, a uniform crystal is not obtained, and a hillock or a pit occurs.

The percentage of the area of the buffer layer 12 covering the front surface 11a of the substrate 11 can be measured from the cross-section TEM photograph shown in FIG. 5. In particular, when the buffer layer 12 and the underlying layer 14a are made of different materials, for example, EDS is used to scan the boundary between the substrate 11 and a layer formed on the substrate 11 in a direction that is parallel to the front surface of the substrate 11, thereby estimating the percentage of a region in which the buffer layer 12 is not formed.

In this embodiment, as described above, the exposed area of the substrate 11 is measured from the cross-section TEM photograph. However, a sample having only the buffer layer 12 formed thereon may be used to measure the exposed area of the substrate 11 using, for example, AFM.

As shown in FIG. 1, the buffer layer 12 may be formed on the substrate 11 so as to cover only the front surface 11a of the substrate 11, or so as to cover the front surface 11a and the side surface of the substrate 11. Alternatively, the buffer layer may be formed so as to cover the front surface 11a, the side surface, and the rear surface of the substrate 11.

It is preferable that the buffer layer 12 be an aggregate of columnar crystals in terms of a buffer function.

The crystal of the group-III nitride compound semiconductor has a hexagonal crystal structure, and is likely to form a texture having a hexagonal column as a base. In particular, a film formed by a deposition method using metallic plasma is more likely to have a columnar crystal.

As described above, when the buffer layer 12 made of a columnar crystal is formed on the substrate 11, the buffer layer 12 has a good buffer function. Therefore, the group-III nitride compound semiconductor formed on the buffer layer becomes a crystal film having high crystallinity.

In addition, in the buffer layer 12, the average of the widths of grains of the columnar crystals is preferably in the range of 0.1 to 100 nm, and more preferably, 1 to 70 nm in terms of the buffer function.

In order to improve the crystallinity of the crystal layer of the group-III nitride compound semiconductor, it is necessary to appropriately control the width of the crystal grain of each columnar crystal. Specifically, it is preferable that the average of the widths of the crystal grains be within the above-mentioned range.

The width of the grain of each columnar crystal can be easily measured from a cross-section TEM photograph. That is, in the schematic diagram shown in FIG. 6, the gap between the columnar crystals at the boundary therebetween is the width of the grain of each columnar crystal. As can be seen from the TEM photograph of FIG. 5, it is difficult to accurately define the width of each columnar crystal, but the width of the columnar crystal is distributed in a predetermined range. Therefore, even when several percent of columnar crystals have a grain width that is out of the above-mentioned range, the effect of the present invention is hardly affected by the columnar crystals. It is preferable that 90% or more of the columnar crystals have a grain width in the above-mentioned range.

As described above, it is preferable that the grain of each crystal has a substantially columnar shape and the buffer layer 12 be formed of an aggregate of cylindrical grains.

The width of the grain is the distance between the interfaces of crystals when the buffer layer 12 is an aggregate of cylindrical grains. When the grains are scattered in island shapes, the width of the grain means the length of a diagonal line of the largest portion of the surface of the crystal grain coming into contact with the surface of the substrate.

The thickness of the buffer layer 12 is preferably in the range of 10 to 500 nm, and more preferably, 20 to 100 nm.

If the thickness of the buffer layer 12 is less than 10 nm, a sufficient buffer function is not obtained. On the other hand, if the thickness of the buffer layer 12 is more than 500 nm, the buffer layer serves as a coating layer, but the deposition time is increased, which results in low productivity.

It is possible to easily measure the thickness of the buffer layer 12 from the above-mentioned cross-section TEM photograph.

The buffer layer 12 is preferably formed of a composition including Al, and more preferably, a composition including AlN.

The buffer layer 12 may be formed of a group-III nitride compound semiconductor that is represented by the general formula AlGaInN. In addition, the buffer layer 12 may be formed of a material including a group-V element, such as As or P.

It is preferable that the buffer layer 12 be formed of GaAlN as a composition including Al. In this case, it is preferable that the content of Al be 50% or more.

In addition, it is preferable that the buffer layer 12 be formed of AlN. In this case, it is possible to effectively form an aggregate of columnar crystals.

As described above, the buffer layer 12 may be formed so as to cover the side surface 11b of the substrate 11 in addition to the front surface 11a, and it may be formed so as to cover the rear surface 11c of the substrate 11. However, when the buffer layer is formed by a deposition method according to the related art, it is necessary to perform a maximum of 6 to 8 deposition processes, and it takes a long time to form the buffer layer. As another deposition method, the following may be used: a method of arranging a substrate in a chamber without holding the substrate to form a buffer layer on the entire surface of the substrate. However, in this case, when it is necessary to heat the substrate, a manufacturing apparatus becomes complicated.

Therefore, for example, a deposition method is considered which swings or rotates a substrate to change the position of the substrate in the sputtering direction of a film-forming material during deposition. In this method, a film is formed on the front surface and the side surface of the substrate by one process and a film is formed on the rear surface of the substrate by the next deposition process. That is, it is possible to form a film on the entire surface of the substrate by a total of two processes.

In addition, the following method may be used: a method of generating a film forming material from a large source, changing the position where the material is generated, and forming a film on the entire surface of a substrate without moving the substrate. An example of the method is an RF sputtering method that swings or rotates a magnet to move the position of the magnet of a cathode in a target during deposition. When the RF sputtering method is used to form a film, both the substrate and the cathode may be moved. In addition, the cathode, which is a material source, may be provided in the vicinity of the substrate to supply plasma so as to surround the substrate without supplying beam-shaped plasma to the substrate. In this case, it is possible to simultaneously form a film on the front surface and the side surface of the substrate.

<Semiconductor Layer>

As shown in FIG. 1, in the laminated semiconductor 10 according to this embodiment, the semiconductor layer 20 including the n-type semiconductor layer 14, the light-emitting layer 15, and the p-type semiconductor layer 16 each made of a nitride compound semiconductor is formed on the substrate 11 with the buffer layer 12 interposed therebetween.

The n-type semiconductor layer 14 includes the underlying layer 14a and the n-type contact layer 14b that are formed of a group-III nitride compound semiconductor by at least a sputtering method, and the underlying layer 14a is formed on the buffer layer 12.

As described above, a crystal layer having the same function as the laminated semiconductor 10 shown in FIG. 1 can be formed on the underlying layer 14a made of a group-III nitride compound semiconductor. For example, when a semiconductor laminated structure for a light-emitting device is formed, an n-type conductive layer doped with an n-type dopant, such as Si, Ge, or Sn, or a p-type conductive layer doped with a p-type dopant, such as Mg, may be formed. For example, a light-emitting layer may be formed of InGaN, and a clad layer may be formed of AlGaN. As such, a group-III nitride semiconductor crystal layer having an additional function can be formed on the underlying layer 14a to manufacture a wafer having a semiconductor laminated structure. The wafer is used to manufacture a light-emitting diode, a laser diode, or an electronic device.

Next, the laminated semiconductor 10 will be described in detail.

Various kinds of gallium nitride compound semiconductors have been known which are represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. M indicates a group-V element different from nitrogen (N) and $0 \leq A < 1$). The present invention can also use any kind of gallium nitride compound semiconductor represented by the general formula $Al_XGa_YIn_ZN_{1-A}M_A$ ($0 \leq X \leq 1$, $0 \leq Y \leq 1$, $0 \leq Z \leq 1$, and $X+Y+Z=1$. M indicates a group-V element different from nitrogen (N) and $0 \leq A < 1$) in addition to the known gallium nitride compound semiconductors.

The gallium nitride compound semiconductor may include group-III elements other than Al, Ga, and In, and it may include elements, such as Ge, Si, Mg, Ca, Zn, Be, P, As, and B, if necessary. In addition, it may include dopants, a raw material, and a very small amount of dopants contained in a reaction coil material that are necessarily contained depending on the deposition conditions, in addition to the elements that are intentionally added.

A method of growing the gallium nitride compound semiconductor is not particularly limited. For example, in addition to the sputtering method, any method of growing a nitride compound semiconductor, such as an MOCVD (metal organic chemical vapor deposition) method, an HVPE (hydride vapor phase epitaxy) method, or an MBE (molecular beam epitaxy) method, may be used to grow the gallium nitride compound semiconductor. The MOCVD method is preferable in terms of the control of the thickness of a film and mass production. In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethylaluminum (TEA) is used as an Al source, trimethylindium (TMI) or triethylindium (TEI) is used as an In source, and ammonium ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, that is, organic germanium compounds, such as germane ($GeH_4$), tetramethylgermanium (($CH_3)_4Ge$), and tetraethylgermanium (($C_2H_5)_4Ge$), are used as n-type dopants. In the MBE method, elemental germanium may be used as a dopant source. Mg-based materials, such as bis-cyclopentadienylmagnesium ($Cp_2Mg$) and bisethylcyclopentadienyl magnesium ($EtCp_2Mg$), are used as p-type dopants.

<N-type Semiconductor Layer>

The n-type semiconductor layer 14 includes an underlying layer 14a, an n-type contact layer 14b, and an n-type clad layer 14c sequentially formed on the buffer layer 12. The n-type contact layer may also serve as the underlying layer and/or the n-type clad layer.

(Underlying Layer)

The underlying layer 14a according to this embodiment is formed of a group-III nitride compound semiconductor, and is formed on the buffer layer 12 by the sputtering method.

The underlying layer 14a is not necessarily formed of the same material as that forming the buffer layer 12 formed on the substrate 11, but it may be formed of a material different from the material forming the buffer layer 12. The underlying layer 14a is preferably formed of $Al_xGa_{1-x}N$ ($0 \leq x \leq 1$, preferably, $0 \leq x \leq 0.5$, and more preferably, $0 \leq x \leq 0.1$).

The inventors' experiments proved that the underlying layer 14a was preferably formed of a group-III nitride compound including Ga, that is, a GaN compound semiconductor.

When the buffer layer 12 is formed of AlN, it is necessary to form a dislocation loop by migration such that the underlying layer 14a does not succeed to the crystallinity of the buffer layer 12, which is an aggregate of columnar crystals. For example, a GaN-based compound semiconductor including Ga may be used as a material that is likely to form the dislocation loop. In particular, AlGaN or GaN is preferable.

The thickness of the underlying layer 14a is preferably greater than 0.1 μm, more preferably, greater than 0.5 μm, most preferably, greater than 1 μm. If the thickness is greater than the above-mentioned range, it is easy to obtain an $Al_xGa_{1-x}N$ layer with high crystallinity.

The underlying layer 14a may be doped with an n-type dopant in the concentration range of $1 \times 10^{17}$ to $1 \times 10^{19}/cm^3$, if necessary, or the underlying layer 14a may be undoped ($<1 \times 10^{17}/cm^3$). It is preferable that the underlying layer 14a be undoped in order to maintain high crystallinity.

For example, when the substrate 11 has conductivity, it is possible to form electrodes on the upper and lower surfaces of the light-emitting device by doping the underlying layer 14a with a dopant to have conductivity. When the substrate 11 is formed of an insulating material, it is possible to form a chip structure in which positive and negative electrodes are formed on the same surface of the light-emitting device. Therefore, it is not necessary to dope the underlying layer 14a with a dopant, and it is preferable that the underlying layer 14a be undoped in order to improve crystallinity.

For example, Si, Ge, and Sn, and preferably, Si and Ge are used as the n-type dopant, but the present invention is not limited thereto.

When a conductive substrate is used as the substrate 11, as described above, the underlying layer 14a is doped with a dopant, and the underlying layer 14a has a layer structure that allows a current to flow in the longitudinal direction. In this way, electrodes can be formed on both surfaces of a chip of the light-emitting device.

When an insulating substrate is used as the substrate 11, a chip structure in which electrodes are formed on one surface of the chip of the light-emitting device is used. Therefore, it is preferable that the underlying layer 14a formed on the substrate 11 with the buffer layer 12 interposed therebetween be undoped, in order to improve the crystallinity.

When the underlying layer 14a is formed by the sputtering method, it is preferable to use a reactive sputtering method that introduces a nitride raw material into a reactor since the reactive sputtering method can control reaction to maintain high crystallinity and stably reproduce high crystallinity.

When the underlying layer 14a is formed by the sputtering method, it is possible to simplify the structure of an apparatus, as compared to MOCVD or MBE.

The temperature of the substrate 11 when the underlying layer 14a is formed, that is, the deposition temperature of the underlying layer 14a is preferably not lower than 800° C. When the temperature of the substrate 11 is high during the deposition of the underlying layer 14a, atoms are more likely to migrate, and it is easy to form a dislocation loop. In addition, the temperature of the substrate 11 when the underlying layer 14a is formed needs to be lower than the temperature at which crystal is decomposed. For example, it is preferable that the temperature of the substrate be lower than 1,200° C. When the temperature of the substrate 11 during the deposition of the underlying layer 14a is in the above-mentioned range, it is possible to obtain the underlying layer 14a having high crystallinity.

(N-type Contact Layer)

The n-type contact layer 14b according to this embodiment is made of a group-III nitride compound semiconductor, and is formed on the underlying layer 14a by the sputtering method.

It is preferable that the n-type contact layer 14b be formed of $Al_xGa_{1-x}N$ ($0 \leq x \leq 1$, preferably, $0 \leq x \leq 0.5$, and more preferably, $0 \leq x \leq 0.1$), similar to the underlying layer 14a. The n-type contact layer is preferably doped with an n-type dopant in the concentration range of $1 \times 10^{17}$ to $1 \times 10^{19}/cm^3$, and more preferably, $1 \times 10^{18}$ to $1 \times 10^{19}/cm^3$, in order to maintain good ohmic contact with the negative electrode, prevent the occurrence of cracks, and maintain high crystallinity. For example, Si, Ge, and Sn, and preferably, Si and Ge are used as the n-type dopant, but the present invention is not limited thereto. The deposition temperature of the n-type contact layer is the same as that of the underlying layer. As described above, the n-type contact layer 14b may also serve as the underlying layer.

It is preferable that the gallium nitride compound semiconductors forming the underlying layer 14a and the n-type contact layer 14b have the same composition. The sum of the thicknesses of the underlying layer and the n-type contact layer is preferably in the range of 0.1 to 20 μm, and preferably, 0.5 to 15 μm, and most preferably, 1 to 12 μm. When the thickness is in the above-mentioned range, it is possible to maintain the crystallinity of the semiconductor at a high level.
(N-type Clad Layer)

It is preferable to provide the n-type clad layer 14c between the n-type contact layer 14b and a light-emitting layer 15, which will be described below. The n-type clad layer 14c makes it possible to restore the unevenness of the outer surface of the n-type contact layer 14b. The n-type clad layer 14c may be formed of, for example, AlGaN, GaN, or GaInN by, for example, a known MOCVD method. In addition, a heterojunction structure of these layers or a superlattice structure of a plurality of layers may be used. When the n-type clad layer is formed of GaInN, it is preferable that the band gap of GaInN of the n-type clad layer be larger than that of GaInN of the light-emitting layer 15.

The thickness of the n-type clad layer 14c is not particularly limited, but is preferably in the range of 5 to 500 nm, and more preferably, 5 to 100 nm.

The n-type dopant concentration of the n-type clad layer 14c is preferably in the range of $1\times10^{17}$ to $1\times10^{20}/cm^3$, and more preferably, $1\times10^{18}$ to $1\times10^{19}/cm^3$. If the dopant concentration is within the above-mentioned range, it is possible to maintain high crystallinity and reduce the driving voltage of a light-emitting device.
<P-type Semiconductor Layer>

In general, the p-type semiconductor layer 16 includes a p-type clad layer 16a and a p-type contact layer 16b, and can be formed by a known MOCVD method. In addition, the p-type contact layer may also serve as the p-type clad layer.
(P-type Clad Layer)

The p-type clad layer 16a is not particularly limited as long as it has a composition that has a band gap energy higher than that of the light-emitting layer 15, which will be described in detail below, and it can confine carriers in the light-emitting layer 15. It is preferable that the p-type clad layer be formed of $Al_dGa_{1-d}N$ ($0<d\leq0.4$, and preferably, $0.1\leq d\leq0.3$). When the p-type clad layer 16a is formed of AlGaN, it is possible to confine carriers in the light-emitting layer 15. The thickness of the p-type clad layer 16a is not particularly limited, but is preferably in the range of 1 to 400 nm, and more preferably, 5 to 100 nm. The p-type dopant concentration of the p-type clad layer 16a is preferably in the range of $1\times10^{18}$ to $1\times10^{21}/cm^3$, and more preferably, $1\times10^{19}$ to $1\times10^{20}/cm^3$. This p-type dopant concentration range makes it possible to obtain a good p-type crystal without deteriorating crystallinity.
(P-type Contact Layer)

The p-type contact layer 16b is composed of a gallium nitride compound semiconductor layer containing at least $Al_eGa_{1-e}N$ ($0\leq e<0.5$, preferably, $0\leq e\leq0.2$, and more preferably, $0\leq e\leq0.1$). When the Al composition is within the above range, it is possible to maintain high crystallinity and low ohmic contact resistance with a p-type ohmic electrode (see a translucent electrode 17, which will be described below).

When the p-type dopant concentration is in the range of $1\times10^{18}$ to $1\times10^{21}/cm^3$, it is possible to maintain low ohmic contact resistance, prevent the occurrence of cracks, and maintain high crystallinity. It is more preferable that the p-type dopant concentration be in the range of $5\times10^{19}$ to $5\times10^{21}/cm^3$.

For example, the p-type dopant may be Mg, but is not limited thereto.

The thickness of the p-type contact layer 16b is not particularly limited, but is preferably in the range of 10 to 500 nm, and more preferably, 50 to 200 nm. This thickness range makes it possible to improve emission power.
<Light-emitting Layer>

The light-emitting layer 15 is formed between the n-type semiconductor layer 14 and the p-type semiconductor layer 16 by, for example, a known MOCVD method. As shown in FIG. 1, the light-emitting layer 15 is formed by alternately laminating barrier layers 15a made of a gallium nitride compound semiconductor and well layers 15b made of a gallium nitride compound semiconductor including indium, and the barrier layers 15a are arranged so as to contact the n-type semiconductor layer 14 and the p-type semiconductor layer 16.

In the structure shown in FIG. 1, the light-emitting layer 15 includes six barrier layers 15a and five well layers 15b alternately formed. The barrier layers 15a are arranged at the uppermost and lowermost sides of the light-emitting layer 15, and the well layer 15b is arranged between the barrier layers 15a.

The barrier layer 15a is preferably formed of, for example, a gallium nitride compound semiconductor, such as $Al_cGa_{1-c}N$ ($0\leq c<0.3$), having a band gap energy that is higher than that of the well layer 15b that is formed of a gallium nitride compound semiconductor including indium.

The well layer 15b may be formed of a gallium indium nitride, such as $Ga_{1-s}In_sN$ ($0<s<0.4$), as the gallium nitride compound semiconductor including indium.

The overall thickness of the light-emitting layer 15 is not particularly limited, but it is preferable that the light-emitting layer 15 has a sufficient thickness to obtain a quantum effect, that is, a threshold thickness. For example, the thickness of the light-emitting layer 15 is preferably in the range of 1 to 500 nm, and more preferably, about 100 nm. If the thickness is in the above-mentioned range, it is possible to improve emission power.
<Translucent Positive Electrode>

The translucent positive electrode 17 is a translucent electrode formed on the p-type semiconductor layer 16 of the laminated semiconductor 10 manufactured in this way.

The material forming the translucent positive electrode 17 is not particularly limited, but the translucent positive electrode 17 may be formed of, for example, ITO ($In_2O_3$—$SnO_2$), AZnO (ZnO—$Al_2O_3$), IZnO ($In_2O_3$—ZnO), or GZO (ZnO—$Ga_2O_3$) by a known means.

In addition, the translucent positive electrode 17 may have any known structure, without any restrictions.

The translucent positive electrode 17 may be formed so as to cover the entire surface of the p-type semiconductor layer 16 doped with Mg, or it may be formed in a lattice shape or a tree shape. After the translucent positive electrode 17 is formed, a thermal annealing process may be performed to form an alloy or make the electrode transparent, or the thermal annealing process may not be performed.
<Positive Electrode Bonding Pad and Negative Electrode>

A positive electrode bonding pad 18 is an electrode that is formed on the translucent positive electrode 17.

The positive electrode bonding pad 18 may be formed of various known materials, such as Au, Al, Ni, and Cu. However, the known materials and the structure of the positive electrode bonding pad are not particularly limited.

It is preferable that the thickness of the positive electrode bonding pad 18 be in the range of 100 to 1000 nm. In addition, the bonding pad has characteristics that, as the thickness thereof increases, bondability is improved. Therefore, it is preferable that the thickness of the positive electrode bonding pad 18 be greater than or equal to 300 nm. In addition, it is preferable that the thickness of the positive electrode bonding pad be less than or equal to 500 nm in order to reduce manufacturing costs.

A negative electrode 19 is formed so as to come into contact with the n-type contact layer 14b of the n-type semiconductor layer 14 in the semiconductor layer, which is a laminate of the n-type semiconductor layer 14, the light-emitting layer 15, and the p-type semiconductor layer 16 sequentially formed on the substrate 11.

Therefore, when the negative electrode bonding pad 17 is formed, the light-emitting layer 15, the p-type semiconductor layer 16, and the n-type semiconductor layer 14 are partially removed to form an exposed region 14d of the n-type contact layer 14b and the negative electrode 19 is formed on the exposed region.

The negative electrode 19 may be formed of any material whose composition and structure have been known, and the negative electrode can be formed by a means that has been known in this technical field.

As described above, according to the method of manufacturing the group-III nitride compound semiconductor light-emitting device of this embodiment, it is possible to form a uniform crystal film in a short time using a sputtering method. In this way, it is possible to stably form a group-III nitride compound semiconductor layer having high crystallinity.

In the manufacturing method according to this embodiment, under the above-mentioned conditions, at least a sputtering method is used to form the underlying layer 14a and the n-type contact layer 14b of the n-type semiconductor layer 14 in the semiconductor layer 20. In this way, it is possible to generate a reactive species having a high bias or high power and supply the reactive species to the substrate 11 with high kinetic energy. Therefore, migration occurs on the substrate 11, and a dislocation loop is easily formed. In this way, the underlying layer 14a of the n-type semiconductor layer 14 does not succeed to the crystallinity of the buffer layer 12, which is an aggregate of columnar crystals formed on the substrate 11. Therefore, it is possible to form a group-III nitride compound semiconductor layer having high crystallinity.

Further, in this embodiment, at least a sputtering method is used to form a semiconductor layer. Therefore, it is possible to increase the deposition rate and reduce the deposition (manufacturing) time. The reduction in the manufacturing time makes it possible to minimize the introduction of impurities into a chamber of a sputtering apparatus.

Therefore, it is possible to obtain a group-III nitride compound semiconductor light-emitting device having high productivity and good emission characteristics.

[Lamp]

A lamp can be formed by combining the group-III nitride compound semiconductor light-emitting device according to the present invention with phosphor by a known means. In recent years, a technique for combining a light-emitting device with phosphor to change the color of emission light has been known, and the lamp according to the present invention can adopt the technique without any restrictions.

For example, it is possible to emit light having a long wavelength from the light-emitting device by appropriately selecting phosphor used for the lamp. In addition, it is possible to achieve a lamp emitting white light by mixing the emission wavelength of the light-emitting device and a wavelength converted by the phosphor.

In addition, the light-emitting device according to the present invention may be used for various types of lamps, such as a general-purpose bullet-shaped lamp, a side view lamp for a backlight of a portable device, and a top view lamp used for a display device.

Figure 4:
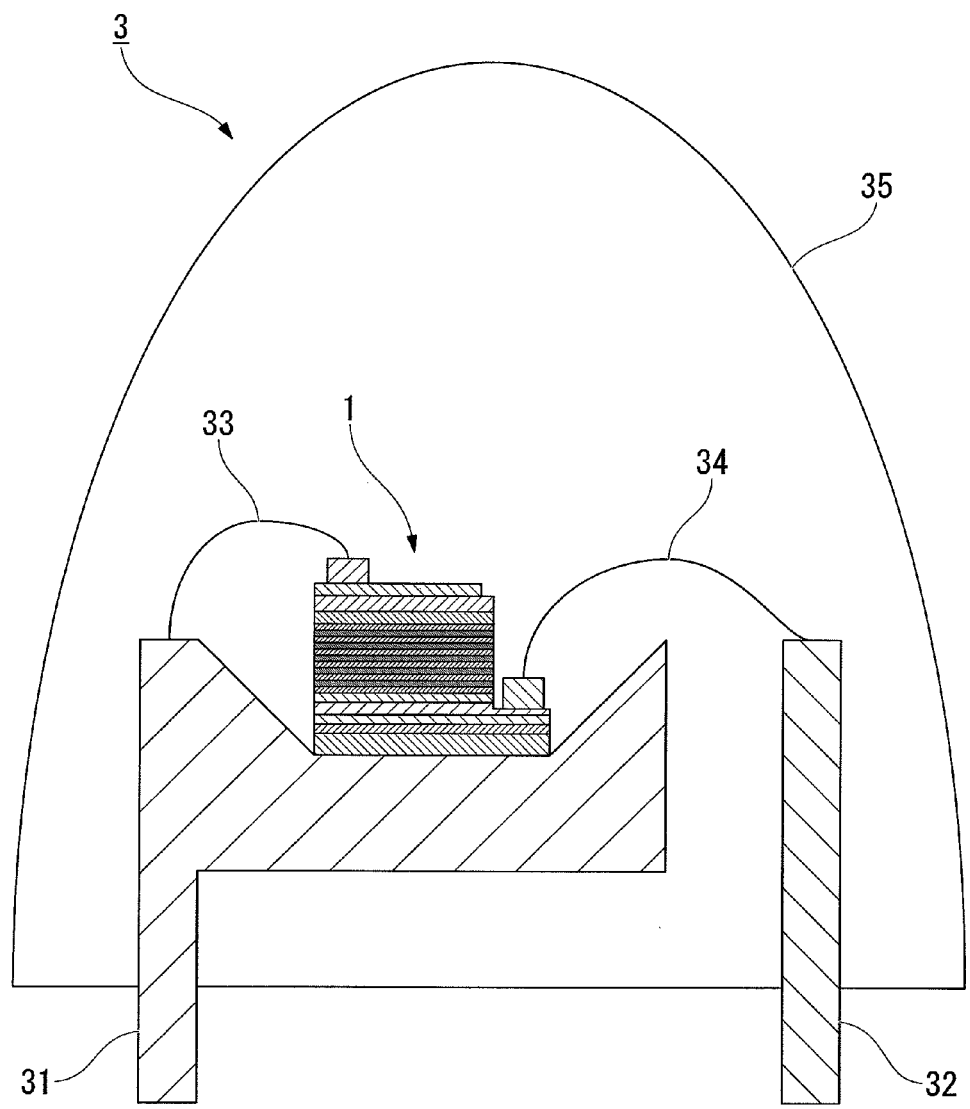
FIG. 4 is a diagram schematically illustrating a lamp including the group-III nitride compound semiconductor light-emitting device according to the present invention.

For example, as shown in FIG. 4, when the group-III nitride compound semiconductor light-emitting device 1 having electrodes formed on the same surface is mounted to a bullet-shaped lamp, the light-emitting device 1 is bonded to one (a frame 31 in FIG. 4) of two frames. In addition, the negative electrode (see reference numeral 19 in FIG. 3) of the light-emitting device 1 is bonded to a frame 32 by a wire 34, and the positive electrode bonding pad (see reference numeral 18 in FIG. 3) of the light-emitting device 1 is bonded to a frame 31 by a wire 33. Then, the periphery of the light-emitting device 1 is sealed by a mold 35 made of a transparent resin. In this way, it is possible to manufacture a bullet-shaped lamp 3 shown in FIG. 4.

The group-III nitride compound semiconductor light-emitting device according to the present invention can be applied to manufacture, for example, photoelectric conversion devices, such as a laser device and a light-receiving device, and electronic devices, such as an HBT and an HEMT, in addition to the light-emitting device. These semiconductor devices have various known structures, and the laminated structure of the group-III nitride compound semiconductor light-emitting device according to the present invention may include these known device structures.

EXAMPLES

Next, the method of manufacturing the group-III nitride compound semiconductor light-emitting device according to the present invention will be described in detail with reference to Examples, but the present invention is not limited to the Examples.

Example 1

FIG. 1 is a cross-sectional view schematically illustrating the structure of a laminated semiconductor of a group-III nitride compound semiconductor light-emitting device according to Example 1.

In Example 1, an aggregate of columnar crystals made of AlN was formed as the buffer layer 12 on the c-plane of the substrate 11 made of sapphire by an RF sputtering method, and a layer made of GaN was formed as the underlying layer 14a on the buffer layer by the RF sputtering method.

A sapphire substrate 11 whose one surface was polished into a mirror surface suitable for epitaxial growth was prepared, and the substrate 11 was provided in a sputtering apparatus, without being subjected to a pre-process, such as a wet process. A sputtering apparatus that had a radio frequency power supply and a mechanism capable of changing the position of a magnet in a target was used.

Then, the substrate 11 was heated up to a temperature of 750° C. in the sputtering apparatus and only nitrogen gas was introduced into the sputtering apparatus at a flow rate of 15 sccm to maintain the internal pressure of the chamber at 0.08 Pa. Then, a high-frequency bias of 50 W was applied to the substrate 11 to generate nitrogen plasma, thereby cleaning the surface of the substrate 11.

Then, argon and nitrogen gases were introduced into the sputtering apparatus, and the temperature of the substrate 11 was reduced to 500° C. Then, an RF bias of 0.5 W/cm$^2$ was applied to the substrate 11, and a power of 1 W/cm$^2$ was supplied to an Al target to form the buffer layer 12 made of AlN on the sapphire substrate 11 under the following conditions: an internal pressure of a furnace of 0.5 Pa; a flow rate of Ar gas of 5 sccm; and a flow rate of nitrogen gas of 15 sccm (the percentage of nitrogen in the entire gas was 75%). The deposition rate was 0.12 nm/s.

The magnet in the target was rotated both during the cleaning of the substrate 11 and during deposition.

An AlN film (buffer layer 12) was formed with a thickness of 50 nm at a predetermined deposition rate for a predetermined time, and then a plasma operation stopped to reduce the temperature of the substrate 11.

Then, the substrate 11 having the buffer layer 12 formed thereon was taken out from the sputtering apparatus, and then transported to another sputtering apparatus. A sample having a GaN layer (group-III nitride compound semiconductor) was manufactured by a sputtering method as follows. As a sputtering apparatus for forming the GaN layer, an apparatus including a radio frequency power supply and a mechanism for sweeping the magnet in a rectangular Ga target to change the position of a magnetic field was used. In addition, a pipe for supplying a cooling medium was provided in the Ga target, and the sputtering apparatus supplied a cooling medium cooled down to a temperature of 20° C. through the pipe, thereby preventing Ga from being melted due to heat.

First, argon and nitrogen gases were introduced into the chamber of the sputtering apparatus, and the temperature of the substrate 11 was increased up to 1000° C. Then, an RF bias of 0.5 W/cm$^2$ was applied to the substrate 11, and a power of 1 W/cm$^2$ was supplied to the Ga target to form a layer made of GaN on the sapphire substrate 11 under the following conditions: an internal pressure of a chamber of 0.5 Pa; a flow rate of Ar gas of 5 sccm; and a flow rate of nitrogen gas of 15 sccm (the percentage of nitrogen in the entire gas was 75%). The deposition rate was about 1 nm/s. After a GaN layer having a thickness of 6 μm was formed, plasma generation was stopped.

Then, under the same conditions, a Si-doped GaN layer having an electron concentration of 1×10$^{19}$ cm$^{-3}$ and a thickness of 2 μm was formed. The deposition conditions were the same as those when an undoped GaN layer was formed, and ions were radiated from an ion gun onto a Si target provided in the chamber to eject Si particles from the Si target, thereby doping the film with Si.

In this way, the buffer layer 12 that was made of AlN and had a cylindrical structure was formed on the sapphire substrate 11, and an undoped GaN layer (underlying layer 14a) was formed with a thickness of 6 μm on the buffer layer. Then, a Si-doped GaN layer (n-type contact layer 14b) having an electron concentration of 1×10$^{19}$ cm$^{-3}$ and a thickness of 2 μm was formed on the undoped GaN layer, thereby manufacturing a sample according to Example 1. The sample had a colorless and transparent front surface.

The X-ray rocking curve (XRC) of the undoped GaN layer (underlying layer 14a) obtained by the above-mentioned method was measured by an X-ray diffractometer (PANalytical's X'pert; four-crystal X-ray diffractometer). In the measuring process, a Cuβ-line X-ray generator was used as a light source and the measurement was performed for (0002) planes, which were symmetric planes, and (11-20) planes, which were asymmetric planes. Generally, in the case of a group-III nitride compound semiconductor, the half width of the XRC spectrum of the (0002) plane is used as an index for the flatness (mosaicity) of crystal and the half width of the XRC spectrum of the (11-20) plane is used as an index for the dislocation density (twist). As a result of the measurement, the (0002) plane of the undoped GaN layer formed by the manufacturing method according to the present invention had a half width of 180 arcseconds and the (11-20) plane thereof had a half width of 300 arcseconds.

Example 2

In Example 2, a Si-doped n-type contact layer 14b was formed on an undoped GaN crystal (underlying layer 14a) which was formed with a thickness of 6 μm under the same conditions as those in Example 1 using the same sputtering apparatus.

Then, the sample was put into an MOCVD furnace, and various layers were formed on the sample. Finally, an epitaxial wafer (laminated semiconductor 10) having an epitaxial layer structure for the group-III nitride compound semiconductor light-emitting device shown in FIG. 1 was manufactured.

The epitaxial wafer had a laminated structure in which the buffer layer 12 that was made of AlN having a columnar crystal structure, the underlying layer 14a that was made of undoped GaN with a thickness of 6 μm, the n-type contact layer 14b that had an electron concentration of 1×10$^{19}$ cm$^{-3}$ and was made of Si-doped GaN with a thickness of 2 μm, an n-type In$_{0.1}$Ga$_{0.9}$N clad layer (n-type clad layer 14c) that had an electron concentration of 1×10$^{18}$ cm$^{-3}$ and a thickness of 20 nm, the light-emitting layer 15 (which has a multiple quantum well structure), and the p-type semiconductor layer 16 were sequentially formed on the sapphire substrate 11 having the c-plane by the same deposition method as that according to Example 1. The light-emitting layer 15 had a laminated structure in which six GaN barrier layers 15a each having a thickness of 16 nm, and five undoped In$_{0.2}$Ga$_{0.8}$N well layers 15b each having a thickness of 3 nm were alternately laminated, and two of the GaN barrier layers were arranged at the uppermost and lowermost sides. The p-type semiconductor layer 16 was formed by laminating a Mg-doped p-type Al$_{0.1}$Ga$_{0.9}$N clad layer 16a with a thickness of 5 nm and a Mg-doped p-type Al$_{0.02}$Ga$_{0.98}$N contact layer 16b with a thickness of 200 nm.

In this way, an epitaxial wafer having an epitaxial layer structure for a semiconductor light-emitting device was manufactured. The Mg-doped p-type Al$_{0.02}$Ga$_{0.98}$N contact layer 16b showed p-type characteristics without being subjected to an annealing process for activating p-type carriers.

Then, the epitaxial wafer (see the laminated semiconductor 10 shown in FIG. 1) having the epitaxial layer structure formed on the sapphire substrate 11 was used to manufacture a light-emitting diode (see the light-emitting device 1 shown in FIGS. 2 and 3), which is a kind of semiconductor light-emitting device.

First, the translucent positive electrode 17 made of ITO and the positive electrode bonding pad 18 having a laminated structure of Ti, Al, and Au layers formed in this order on the surface of the translucent positive electrode 17 were sequentially formed on the surface of the Mg-doped p-type Al$_{0.02}$Ga$_{0.98}$N contact layer 16b of the wafer by a known photolithography method. Then, dry etching was performed on a portion of the wafer to expose the exposed region 14d from the n-type contact layer 14b. Then, the negative electrode 19 having a four-layer structure of Ni, Al, Ti, and Au layers was formed on the exposed region 14d, thereby forming the electrodes shown in FIGS. 2 and 3 on the wafer.

The rear surface of the substrate 11 of the wafer having the electrodes formed on the p-type semiconductor layer and the n-type semiconductor layer was ground or polished into a mirror surface, and then the wafer was cut into individual square chips each having a 350 μm square. Then, the chip was mounted to a lead frame with each electrode facing upward, and then connected to the lead frame by gold wires, thereby obtaining a semiconductor light-emitting device. A forward current of 20 mA was applied between the positive electrode bonding pad 18 and the negative electrode 19 of the semiconductor light-emitting device (light-emitting diode) to measure a forward voltage. As a result, the forward voltage was 3.0 V. In addition, the emission state was observed through the p-side translucent positive electrode 17. As a result, the emission wavelength was 470 nm and the emission power was 15 mW. The emission characteristics of the light-emitting diode were obtained from substantially the entire surface of the manufactured wafer, without any variation.

Example 3

In Example 3, an aggregate of columnar crystals of AlN was formed as a buffer layer on the c-plane of a sapphire substrate using a rotary-cathode-type RF sputtering apparatus, and GaN layers (the underlying layer 14a and the n-type contact layer 14b) were formed on the buffer layer using the same sputtering apparatus as that used to form the AlN buffer layer. Then, a light-emitting device semiconductor laminated structure was formed on the GaN layer by MOCVD, similar to Example 2.

The temperature of the substrate was 700° C. when the buffer layer was sputtered, and the temperature of the substrate was 900° C. when the underlying layer was formed. The other deposition conditions were the same as those in Example 2.

Then, the wafer was taken out from a reactor, and it was found that the front surface of the wafer was a mirror surface.

Then, a cross-section TEM method was used to observe the wafer. The observation showed that the AlN layer (buffer layer) formed by RF sputtering included columnar crystals having a grain width of about 50 nm. In addition, the buffer layer was formed so as to cover the entire surface of the substrate.

Then, a light-emitting diode chip was obtained from the manufactured wafer by the same method as that in Example 2. A forward current of 20 mA was applied between electrodes to measure a forward voltage. As a result, the forward voltage was 3.1 V. In addition, the emission state was observed through the p-side translucent positive electrode. As a result, the emission wavelength was 460 nm and the emission power was 13 mW. The emission characteristics of the light-emitting diode were obtained from substantially the entire surface of the manufactured wafer, without any variation.

Example 4

In Example 4, an aggregate of columnar crystals of AlGaN was formed as a buffer layer on a Si (111) substrate using a rotary-cathode-type RF sputtering apparatus, and a Si-doped AlGaN layer was formed as an underlying layer on the buffer layer using the same sputtering apparatus as that used in Example 1. Then, the same light-emitting device semiconductor laminated structure as that in Example 2 was formed on the underlying layer. In this case, the content of Al in the buffer layer was 70%, and the content of Al in the underlying layer was 15%. In addition, during sputtering, the temperature of the substrate was 500° C., and the underlying layer was formed at a temperature of 700° C. The other deposition conditions were the same as those in Example 1.

In Example 4, after the light-emitting device semiconductor laminated structure was formed, the wafer was taken out from a reactor, and it was found that the front surface of the wafer was a mirror surface.

Then, a cross-section TEM method was used to observe the wafer. The observation showed that the GaAlN layer (buffer layer) formed by RF sputtering included columnar crystals having a grain width of about 30 nm. In addition, the buffer layer was formed so as to cover the entire surface of the substrate.

Then, a light-emitting diode chip was obtained from the manufactured wafer by the same method as that in Example 2. In this example, electrodes were formed on the upper and lower surfaces of the semiconductor laminated structure and the substrate. A forward current of 20 mA was applied between the electrodes to measure a forward voltage. As a result, the forward voltage was 2.9 V.

In addition, the emission state was observed through the p-side translucent positive electrode. As a result, the emission wavelength was 460 nm and emission power was 10 mW. The emission characteristics of the light-emitting diode were obtained from substantially the entire surface of the manufactured wafer, without any variation.

Example 5

In Example 5, an aggregate of columnar crystals of GaN was formed as a buffer layer on a ZnO (0001) substrate by an RF magnetron sputtering method, and a Ge-doped AlGaN layer was formed as an underlying layer on the buffer layer using the same sputtering apparatus as that used in Example 1. Then, the same light-emitting device semiconductor laminated structure as that in Example 2 was formed on the underlying layer.

In this case, the content of Al in the underlying layer was 10%. In addition, when the buffer layer was formed, the temperature of the substrate was room temperature, and when the underlying layer was formed, the temperature of the substrate was 750° C. In this example, the amount of In raw material included in the light-emitting layer was increased in order to manufacture a green LED emitting light in a wavelength of about 525 nm.

In Example 5, after the light-emitting device semiconductor laminated structure was formed, the wafer was taken out from a reactor, and it was found that the front surface of the wafer was a mirror surface.

Then, a cross-section TEM method was used to observe the wafer. The observation showed that the GaN layer included columnar crystals having a grain width of about 5 nm. In addition, the buffer layer was formed so as to cover the entire surface of the substrate.

Then, a light-emitting diode chip was obtained from the manufactured wafer by the same method as that in Example 2. In this example, similar to Example 4, electrodes were formed on the upper and lower surfaces of the laminated structure and the substrate. A forward current of 20 mA was applied between the electrodes to measure a forward voltage. As a result, the forward voltage was 3.3 V. In addition, the emission state was observed through the p-side translucent positive electrode. As a result, the emission wavelength was 525 nm and the emission power was 10 mW. The emission characteristics of the light-emitting diode were obtained from substantially the entire surface of the manufactured wafer, without any variation.

The above-mentioned results proved that the group-III nitride compound semiconductor light-emitting device according to the present invention had high productivity and good emission characteristics.

(Second Embodiment)

A second embodiment is similar to the first embodiment except for the following matters.

In this embodiment, important parameters in deposition using a sputtering method are, for example, the bias, power supplied to a target, the substrate temperature, the internal pressure of a furnace, the partial pressure of nitrogen, and the deposition rate.

In a manufacturing method according to this embodiment, when a semiconductor layer is formed by sputtering, the bias applied to a substrate 11 is preferably not lower than 0.1 W/cm$^2$, more preferably, not lower than 0.2 W/cm$^2$, and most preferably, not lower than 0.5 W/cm$^2$.

When the bias applied to the substrate 11 is in the above-mentioned range, it is possible to generate a high-bias reactive species and supply the reactive species to the substrate 11 with high kinetic energy. Therefore, migration is activated on the substrate 11, and it is easy to form a dislocation loop.

In addition, in the manufacturing method according to this embodiment, when a semiconductor layer is formed by sputtering, power supplied to a metal target (sputtering target) 47 is preferably in the range of 0.1 W/cm$^2$ to 100 W/cm$^2$, more preferably, 1 W/cm$^2$ to 50 W/cm$^2$, and most preferably, 1.5 W/cm$^2$ to 50 W/cm$^2$.

When the power supplied to the metal target 47 is in the above-mentioned range, it is possible to generate a high-power reactive species and supply the reactive species to the substrate 11 with high kinetic energy. Therefore, migration is activated on the substrate 11, and it is easy to form a dislocation loop.

(Third Embodiment)

A third embodiment is similar to the first embodiment except for the following matters.

In a manufacturing method according to this embodiment, when a semiconductor layer is formed, nitrogen (N$_2$) and argon (Ar) are supplied into a chamber (see reference numeral 41 in FIG. 7) for sputtering.

Further, in the manufacturing method according to this embodiment, when the semiconductor layer is formed, the internal pressure of the chamber is lower than or equal to 10 Pa.

Furthermore, in the manufacturing method according to this embodiment, when the semiconductor layer is formed, the temperature of the substrate is set in the range of 400° C. to 1,300° C.

Further, in the manufacturing method according to this embodiment, when the semiconductor layer is formed, the deposition rate is set in the range of 0.1 to 10 nm/sec.

A buffer layer 12 may be formed so as to cover the side surface of the substrate 11 in addition to a front surface 11a, and the buffer layer 12 may be formed so as to cover the rear surface of the substrate 11.

A negative electrode 19 is formed so as to come into contact with an n-type contact layer 14b of an n-type semiconductor layer 14 in a semiconductor layer, which is a laminate of the n-type semiconductor layer 14, a light-emitting layer 15, and a p-type semiconductor layer 16 sequentially formed on the substrate 11.

Therefore, when the negative electrode 19 is formed, the light-emitting layer 15, the p-type semiconductor layer 16, and the n-type semiconductor layer 14 are partially removed to form an exposed region 14d of the n-type contact layer 14b, and the negative electrode 19 is formed on the exposed region.

The negative electrode 19 may be formed of any material whose composition and structure have been known, and the negative electrode can be formed by a means that has been known in this technical field.

[Method of Manufacturing Light-emitting Device]

Next, an example of a method of manufacturing the light-emitting device 1 shown in FIGS. 2 and 3 will be described.

As described above, the method of manufacturing the light-emitting device according to the present invention includes a process of forming, on a substrate 11, semiconductor layers each made of a group-III nitride compound semiconductor including Ga as a group-III element, using a sputtering method.

In order to form a group-III nitride compound semiconductor having high crystallinity on the substrate using a sputtering method, it is necessary to generate a reactive species having high energy to activate migration on the substrate. Therefore, in this embodiment, the following method is used.

<Method of Manufacturing Laminated Semiconductor>

In the manufacturing method according to this embodiment, when a group-III nitride compound semiconductor crystal is epitaxially grown on the substrate 11 to form the laminated semiconductor 10 shown in FIG. 1, the buffer layer 12 is formed on the substrate 11, and a semiconductor layer 20 is formed on the buffer layer. In this embodiment, among various layers of the semiconductor layer 20, the underlying layer 14a and the n-type contact layer 14b of the n-type semiconductor layer 14 are formed by sputtering. Then, an n-type clad layer 14c of the n-type semiconductor layer 14, the light-emitting layer 15, and a p-type clad layer 16a and a p-type contact layer 16b of the p-type semiconductor layer 16 are sequentially formed on the n-type contact layer by MOCVD.

<Formation of Buffer Layer>

It is preferable that a wet pre-process be performed on the substrate 11 when forming the buffer layer 12 on the substrate 11. For example, a known RCA cleaning method is performed on the substrate 11 made of silicon to hydrogen-terminate the front surface of the substrate. In this way, the deposition process is stabilized.

In addition, after the substrate 11 is put into a reactor, it is possible to perform a pre-process on the substrate using, for example, a sputtering method, before the buffer layer 12 is formed. Specifically, it is possible to arrange the front surface of the substrate 11 by exposing the substrate in Ar or N$_2$ plasma. For example, it is possible to remove an organic material or an oxide adhered to the front surface of the substrate 11 by exposing the front surface of the substrate 11 in, for example, Ar gas or N$_2$ gas plasma. In this case, when a voltage is applied between the substrate 11 and the chamber, plasma particles effectively act on the substrate 11.

After the pre-process is performed on the front surface of the substrate 11, argon and nitrogen gases are introduced into the sputtering apparatus to reduce the temperature of the substrate 11 to about 500° C. Then, an RF bias is applied to the substrate 11, and power is supplied to an Al target to form the buffer layer 12 made of AlN on the substrate 11 while maintaining the internal pressure of the furnace at a constant level.

A method of forming the buffer layer 12 on the substrate 11 is not particularly limited. For example, in addition to the sputtering method, an MOCVD method, a pulsed laser deposition (PLD) method, and a pulsed electron beam deposition (PED) method may be used. Among the methods, the sputtering method is preferable since it is simple and is suitable for mass production. When a DC sputter is used, the surface of a target is charged up, and the deposition rate is likely to be unstable. Therefore, it is preferable to use a pulsed DC sputtering method or an RF sputtering method.

The buffer layer 12 formed on the substrate 11 is preferably formed of a composition including Al, and more preferably, a composition including AlN. The buffer layer 12 may be formed of a group-III nitride compound semiconductor that is represented by the general formula AlGaInN. In addition, the buffer layer 12 may be formed of a material including a group-V element, such as As or P.

It is preferable that the buffer layer 12 be formed of GaAlN as a composition including Al. In this case, it is preferable that the content of Al be 50% or more.

In addition, it is more preferable that the buffer layer 12 be formed of AlN. In this case, it is possible to effectively form an aggregate of columnar crystals.

As described above, the buffer layer 12 may be formed so as to cover the side surface of the substrate 11 in addition to the front surface 11a, and it may be formed so as to cover the rear surface of the substrate 11.

However, when the buffer layer is formed by a deposition method according to the related art, it is necessary to perform a maximum of 6 to 8 deposition processes, and it takes a long time to form the buffer layer. As another deposition method, the following may be used: a method of arranging a substrate in a chamber without holding the substrate to form a buffer layer on the entire surface of the substrate. However, in this case, when it is necessary to heat the substrate, a manufacturing apparatus becomes complicated.

Therefore, for example, the following deposition method is considered which swings or rotates a substrate to change the position of the substrate in the sputtering direction of a film-forming material during deposition. In this method, a film is formed on the front surface and the side surface of the substrate by one process and a film is formed on the rear surface of the substrate by the next deposition process. That is, it is possible to form a film on the entire surface of the substrate by a total of two processes.

In addition, the following method may be used: a method of generating a film forming material (target) from a large source, changing the position where the material is generated, and forming a film on the entire surface of a substrate without moving the substrate. An example of the method is an RF sputtering method that swings or rotates a magnet to move the position of the magnet of a cathode in a target during deposition.

When the RF sputtering method is used to form a film, both the substrate and the cathode may be moved. In addition, the cathode, which is a material source, may be provided in the vicinity of the substrate to supply plasma so as to surround the substrate without supplying beam-shaped plasma to the substrate. In this case, it is possible to simultaneously form a film on the front surface and the side surface of the substrate.

<Formation of Semiconductor Layer>

The n-type semiconductor layer 14, the light-emitting layer 15, and the p-type semiconductor layer 16 are sequentially formed on the buffer layer 12 to form the semiconductor layer 20. In the manufacturing method according to this embodiment, as described above, among various layers of the semiconductor layer 20, the underlying layer 14a and the n-type contact layer 14b of the n-type semiconductor layer 14 are formed by sputtering. Then, the n-type clad layer 14c, the light-emitting layer 15, and the p-type semiconductor layer 16 are sequentially formed on the n-type contact layer by MOCVD.

A method of growing the gallium nitride compound semiconductor is not particularly limited. For example, in addition to the sputtering method, any method of growing a nitride compound semiconductor, such as an MOCVD (metal organic chemical vapor deposition) method, an HVPE (hydride vapor phase epitaxy) method, or an MBE (molecular beam epitaxy) method, may be used to grow the gallium nitride compound semiconductor. The MOCVD method is preferable in terms of the control of the thickness of a film and mass production. In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethylaluminum (TEA) is used as an Al source, trimethylindium (TMI) or triethylindium (TEI) is used as an In source, and ammonium ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, that is, organic germanium compounds, such as germane ($GeH_4$), tetramethylgermanium (($CH_3)_4Ge$), and tetraethylgermanium (($C_2H_5)_4Ge$), are used as n-type dopants. In the MBE method, elemental germanium may be used as a dopant source. Mg-based materials, such as bis-cyclopentadienylmagnesium ($Cp_2Mg$) and bisethylcyclopentadienyl magnesium ($EtCp_2Mg$), are used as p-type dopants.

(Formation of Underlying Layer and N-type Contact Layer)

When the semiconductor layer 20 according to this embodiment is formed, first, the underlying layer 14a of the n-type semiconductor layer 14 is formed on the buffer layer 12 by sputtering. Then, the n-type contact layer 14b is formed on the underlying layer 14a by sputtering.

In the manufacturing method according to this embodiment, when the underlying layer 14a and the n-type contact layer 14b are formed by sputtering, nitrogen and argon are supplied into a chamber for sputtering.

Figure 7:
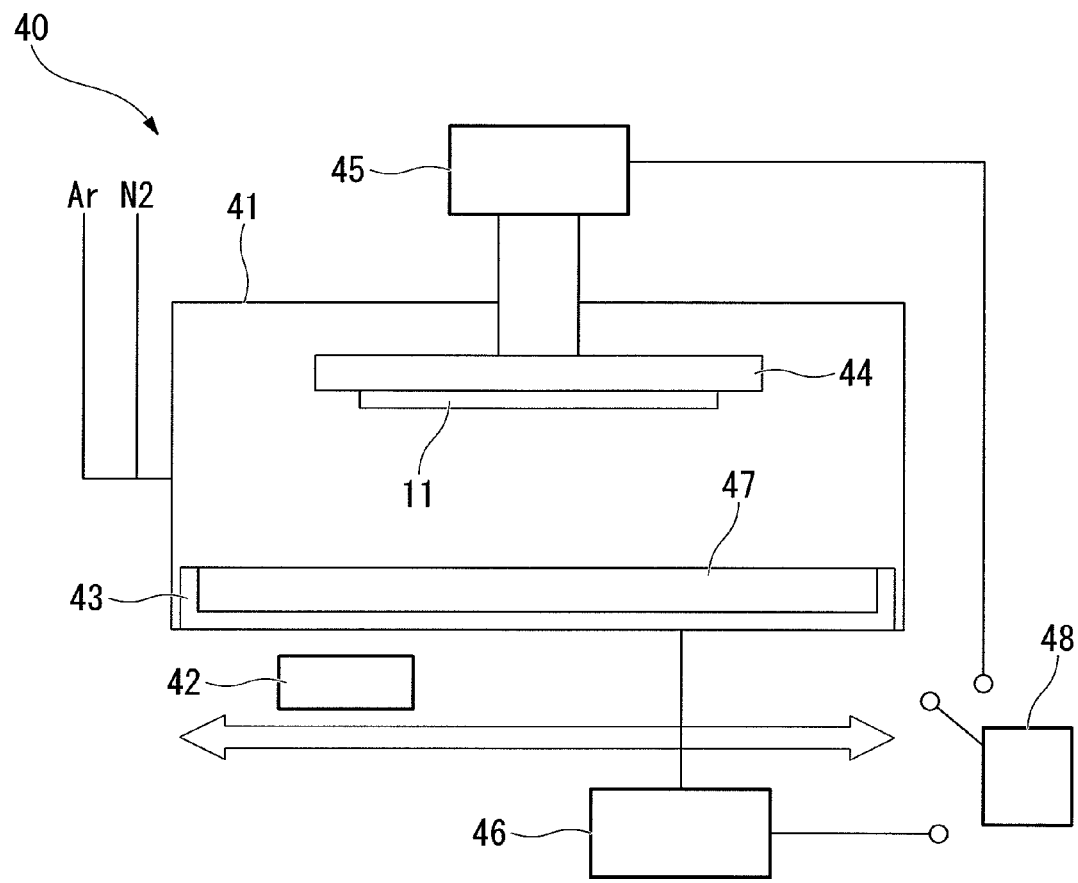
FIG. 7 is a diagram schematically illustrating an example of a method of manufacturing the group-III nitride compound semiconductor light-emitting device according to the present invention, and shows the schematic structure of a swing-type sputtering apparatus.

In the manufacturing method according to this embodiment, for example, the sputtering apparatus 40 shown in FIG. 7 can be used to form the underlying layer 14a and the n-type contact layer 14b. In the sputtering apparatus 40 shown in FIG. 7, a magnet 42 is provided below a sputtering target 47 (a lower side in FIG. 7), and the magnet 42 is swinged along a target table 43 below the sputtering target 47 by a driving device (not shown). A nitrogen gas and an argon gas are supplied into the chamber 41, and a semiconductor layer is formed on the substrate 11 to which a heater 44 is attached by sputtering.

Next, a method of using the sputtering apparatus 40 shown in FIG. 7 to form the underlying layer 14a and the n-type contact layer 14b will be described.

First, argon and nitrogen gases are introduced into the chamber 41 to increase the temperature of the substrate 11 to 1000° C. Then, an RF bias is applied to the substrate 11, and power is supplied to the sputtering target 47 made of Ga to form the undoped underlying layer 14a made of GaN on the substrate 11 while maintaining the internal pressure of the chamber at 0.5 Pa.

Then, under the same sputtering conditions as those forming the underlying layer 14a, the n-type layer 14b made of Si-doped GaN is formed. In this case, ions are radiated from an ion gun onto a Si target (not shown) provided in the chamber 41 to eject Si particles from the Si target, thereby doping the GaN layer with Si. In this way, the undoped GaN underlying layer 14a is formed on the buffer layer 12, and the n-type contact layer 14b made of Si-doped GaN is formed on the underlying layer.

An RF (radio frequency) sputtering method or a DC sputtering method may be used as the sputtering method used in the manufacturing method according to this embodiment to supply power to a sputtering target.

In general, when reactive sputtering, which will be described below, is used, the RF sputtering method is preferable since it can easily control the deposition rate.

In the DC sputtering method, when reactive sputtering is used and a DC voltage is continuously applied, a sputtering target is charged up, and it is difficult to increase the deposition rate. Therefore, it is preferable to use a pulsed DC sputtering method that applies a pulse bias.

When semiconductor layers (the underlying layer 14a and the n-type contact layer 14b) are formed by sputtering, it is preferable to use a reactive sputtering method that introduces a nitride raw material into a reactor since it can control reaction to maintain high crystallinity and stably reproduce high crystallinity.

Further, when the sputtering method is used to form the semiconductor layers, it is preferable to rotate or swing a magnetic field applied to the sputtering target 47, as in the sputtering apparatus 40 shown in FIG. 7.

In particular, when the RF sputtering method is used, it is preferable to perform deposition while moving the position of a magnet in a target (sputtering target) in order to obtain a uniform thickness. A method of moving the magnet is appropriately selected depending on the kind of sputtering apparatus. For example, it is possible to swing or rotate the magnet.

In order to deposit a mixed crystal using a sputtering method, any of the following methods may be used: a method of preparing a metal target made of a mixture of metal materials (an alloy is not necessarily formed) in advance; and a method of preparing two targets made of different materials and sputtering the targets at the same time. For example, when a film having a predetermined composition is formed, a target made of a mixture of materials may be used. When several films having different compositions are formed, a plurality of targets may be provided in the chamber.

When the underlying layer 14a and the n-type contact layer 14b are formed by the sputtering method, it is preferable to use a reactive sputtering method that introduces a nitride raw material into a reactor since the reactive sputtering method can control reaction to maintain high crystallinity and stably reproduce high crystallinity. When the underlying layer 14a and the n-type contact layer 14b are formed by the sputtering method, it is possible to simplify the structure of an apparatus, as compared to MOCVD or MBE.

In the manufacturing method according to this embodiment, it is preferable that the ratio of the flow rate of nitrogen ($N_2$) to the flow rate of Ar be in the range of 20% to 98%. If the ratio of the flow rate of $N_2$ is lower than the above-mentioned range, a sputtering metal, not sputtering particles, is adhered to the substrate. On the other hand, when the ratio between the flow rates is higher than the above-mentioned range, the amount of Ar is excessively small, and the sputtering rate is lowered.

It is more preferable that the ratio of the flow rate of nitrogen ($N_2$) to the flow rate of Ar be in the range of 25% to 90%.

In the manufacturing method according to this embodiment, as described above, the concentration of $N_2$ in the gas in the chamber of the sputtering apparatus is increased, and Ar, which is a heavy gas, is mixed with nitrogen at the above-mentioned flow ratio. If there is only $N_2$ in the chamber, impact against the metal target 47 is weak, and the deposition rate is limited. However, in this embodiment, it is possible to improve the deposition rate and activate migration on the substrate 11 by mixing Ar, which is a heavy gas, with nitrogen at the above-mentioned flow ratio.

As the nitrogen raw material used in this embodiment, a general nitrogen compound may be used. However, it is preferable to use ammonia or $N_2$ gas since it is easy to treat and is relatively inexpensive.

Ammonia has high decomposition efficiency and can be deposited at a high deposition rate. However, ammonia has high reactivity and toxicity. Therefore, ammonia requires a detoxification facility or a gas detector, and it is necessary that a member used for a reactor be made of a material having high chemical stability. When $N_2$ gas is used as a raw material, a simple apparatus can be used, but it is difficult to obtain a high reaction rate. However, when a method of decomposing $N_2$ gas with, for example, an electric field or heat and introducing it into an apparatus is used, it is possible to obtain a deposition rate that is sufficient for industrial manufacture but is lower than that when ammonia is used. Therefore, $N_2$ gas is most preferable in terms of manufacturing costs.

In the manufacturing method according to this embodiment, when the underlying layer 14a and the n-type contact layer 14b are formed, the internal pressure of the chamber 41 is preferably lower than 10 Pa, more preferably, lower than 5 Pa, and most preferably, lower than 1 Pa. When the internal pressure of the chamber 41 is in the above-mentioned range, it is possible to effectively form the underlying layer 14a and the n-type contact layer 14b having high crystallinity. If the internal pressure of the chamber 41 is higher than 10 Pa, it is difficult to obtain the underlying layer 14a and the n-type contact layer 14b having high crystallinity.

In addition, it is preferable that the internal pressure of the chamber 41 when a semiconductor layer is formed by sputtering be higher than or equal to 0.3 Pa. If the internal pressure of the chamber 41 is lower than 0.3 Pa, the amount of nitrogen is excessively small, and there is a concern that the sputtering metal without being nitrified will be adhered to the substrate 11.

The inventors' experiments proved that, when a semiconductor layer was formed by sputtering, the temperature of the substrate 11 was preferably in the range of 400 to 1,300° C. The reason is that, when the temperature of the substrate 11 is increased during the deposition of the underlying layer 14a and the n-type contact layer 14b, migration of atoms is likely to be activated and it is easy to form a dislocation loop. In addition, when the underlying layer 14a and the n-type contact layer 14b are formed, the temperature of the substrate 11 needs to be lower than the decomposition temperature of crystal. Therefore, it is preferable that the temperature of the substrate be lower than 1,300° C.

When sputtering is performed within the above-mentioned temperature range of the substrate 11, it is possible to obtain the underlying layer 14a and the n-type contact layer 14b having high crystallinity.

In the manufacturing method according to this embodiment, when a semiconductor layer is formed by sputtering, the above-mentioned temperature range of the substrate 11, which is a high temperature range, makes it possible to activate the migration of a reactive species (metal particles ejected from the metal target 47) reaching the substrate 11 on the crystal surface.

In the manufacturing method according to this embodiment, when a semiconductor layer is formed by sputtering, the deposition rate is preferably set in the range of 0.1 to 10 nm/sec.

If the deposition rate is lower than 0.1 nm/s, it takes a long time to perform a deposition process, and manufacturing yield is reduced. If the deposition rate is higher than 10 nm/s, it is difficult to obtain a good film.

In the manufacturing method according to this embodiment, under the above-mentioned conditions, nitrogen and argon gases are supplied into the chamber and a sputtering method is used to form the underlying layer 14a and the n-type contact layer 14b of the n-type semiconductor layer 14 in the semiconductor layer 20. In this way, it is possible to generate a reactive species having a high bias or high power and supply the reactive species to the surface of the buffer layer 12 with high kinetic energy. Therefore, migration occurs on the buffer layer 12, and a dislocation loop is easily formed. In this way, the underlying layer 14a of the n-type semiconductor layer 14 of the semiconductor layer 20 does not succeed to the crystallinity of the buffer layer 12, which is an aggregate of columnar crystals formed on the substrate 11. Therefore, it is possible to effectively form a group-III nitride compound semiconductor layer having high productivity and crystallinity.

Further, in the manufacturing method according to this embodiment, nitrogen and argon gases are supplied into the chamber and a sputtering method is used to form the underlying layer 14a and the n-type contact layer 14b. Therefore, it is possible to increase the deposition rate and reduce the deposition (manufacturing) time, as compared to MOCVD.

The reduction in the manufacturing time makes it possible to minimize the introduction of impurities into the chamber of a sputtering apparatus.

(Formation of N-type Clad Layer)

In this embodiment, an MOCVD method is used to form the n-type clad layer 14c on the n-type contact layer 14b formed by the sputtering method.

In this case, the substrate 11 having the buffer layer 12, the underlying layer 14a, and the n-type contact layer 14b sequentially formed thereon is put in an MOCVD furnace, and an n-type $In_{0.1}Ga_{0.9}N$ clad layer 14c is formed on the n-type contact layer 14b by a known method.

(Formation of Light-emitting Layer)

The light-emitting layer 15 is formed on the n-type clad layer 14c by an MOCVD method.

In this embodiment, the light-emitting layer 15 shown in FIG. 1 has a laminated structure in which six GaN barrier layers 15a and five undoped $In_{0.2}Ga_{0.8}N$ well layers 15b are alternately laminated, and two of the GaN barrier layers are arranged at the uppermost and lowermost sides.

Further, in the manufacturing method according to this embodiment, the same MOCVD furnace as that used to form the n-type clad layer 14c can be used to form the light-emitting layer 15 by a known MOCVD method.

(Formation of P-type Clad Layer and P-type Contact Layer)

The p-type semiconductor layer 16 including a p-type clad layer 16a and a p-type contact layer 16b is formed on the light-emitting layer 15, that is, the barrier layer 15a, which is the uppermost layer of the light-emitting layer 15, by MOCVD.

In this embodiment, first, a Mg-doped p-type $Al_{0.1}Ga_{0.9}N$ clad layer 16a is formed on the light-emitting layer 15 (the barrier layer 15a, which is the uppermost layer), and a Mg-doped p-type $Al_{0.02}Ga_{0.98}N$ contact layer 16b is formed on the p-type clad layer.

In the manufacturing method according to this embodiment, the same MOCVD furnace as that used to form the n-type clad layer 14c and the light-emitting layer 15 can be used to form the p-type semiconductor layer 16 by a known MOCVD method.

<Formation of Translucent Positive Electrode>

The translucent positive electrode 17 made of ITO is formed on the p-type contact layer 16b of the laminated semiconductor 10 having the buffer layer 12 and the semiconductor layers formed on the substrate 11 by the above-mentioned method.

A method of forming the translucent positive electrode 17 is not particularly limited, but the translucent positive electrode may be formed by any method that has been known in this technical field. In addition, the translucent positive electrode may have any known structure, without any restrictions.

The translucent positive electrode 17 according to this embodiment is formed of ITO ($In_2O_3$—$SnO_2$), but the present invention is not limited thereto. For example, the translucent positive electrode 17 may be formed of AZO (ZnO—$Al_2O_3$), IZO ($In_2O_3$—ZnO), or GZO (ZnO—$Ga_2O_3$).

After the translucent positive electrode 17 is formed, a thermal annealing process may be performed to form an alloy or make the electrode transparent, or the thermal annealing process may not be performed.

<Formation of Positive Electrode and Negative Electrode>

A positive electrode bonding pad 18 is formed on the translucent positive electrode 17 formed on the laminated semiconductor 10.

The positive electrode bonding pad 18 may be formed by laminating Ti, Al, and Au layers on the translucent positive electrode 17 in this order using a known method.

When a negative electrode 19 is formed, first, the p-type semiconductor layer 16, the light-emitting layer 15, and the n-type semiconductor layer 14 formed on the substrate 11 are partially removed by, for example, dry etching to form an exposed region 14d of the n-type contact layer 14b (see FIGS. 2 and 3).

Then, the negative electrode 19 having a four-layer structure is formed on the exposed region 14d by sequentially laminating Ni, Al, Ti, and Au layers on the exposed region 14d using a known method.

Then, the rear surface of the substrate 11 of the wafer having the translucent positive electrode 17, the positive electrode bonding pad 18, and the negative electrode 19 are formed on the laminated semiconductor 10 is ground or polished into a mirror surface, and then the wafer is cut into individual square chips each having a 350 μm square, thereby obtaining a light-emitting device chip (light-emitting device 1).

As described above, according to the method of manufacturing the group-III nitride compound semiconductor light-emitting device of this embodiment, it is possible to form a uniform crystal film in a short time using a sputtering method. In this way, it is possible to stably form a group-III nitride compound semiconductor layer having high crystallinity.

In the manufacturing method according to this embodiment, under the above-mentioned conditions, nitrogen and argon gases are supplied into the chamber 41 and a sputtering method is used to form the underlying layer 14a and the n-type contact layer 14b of the n-type semiconductor layer 14 in the semiconductor layer 20 made of a group-III nitride compound including Ga. In this way, it is possible to generate a reactive species having a high bias or high power and supply the reactive species to the surface of the substrate 11 with high kinetic energy. Therefore, migration occurs on the buffer layer 12, and a dislocation loop is easily formed. In this way, the underlying layer 14a of the n-type semiconductor layer 14 does not succeed to the crystallinity of the buffer layer 12, which is an aggregate of columnar crystals formed on the substrate 11. Therefore, it is possible to form a group-III nitride compound semiconductor layer having high crystallinity.

Further, in this embodiment, nitrogen and argon gases are supplied into the chamber 41 and a sputtering method is used to form the underlying layer 14a and the n-type contact layer 14b. Therefore, it is possible to increase the deposition rate of the semiconductor layer 20 and reduce the deposition (manufacturing) time. The reduction in the manufacturing time makes it possible to minimize the introduction of impurities into the chamber of a sputtering apparatus.

Therefore, it is possible to obtain a group-III nitride compound semiconductor light-emitting device having good emission characteristics and high productivity.

[Lamp]

A lamp can be formed by combining the group-III nitride compound semiconductor light-emitting device according to the present invention with the phosphor by a known means. In recent years, a technique for combining a light-emitting device with the phosphor to change the color of emission light has been known, and the lamp according to the present invention can adopt the technique without any restrictions.

For example, it is possible to emit light having a long wavelength from the light-emitting device by appropriately selecting the phosphor used for the lamp. In addition, it is possible to achieve a lamp emitting white light by mixing the emission wavelength of the light-emitting device and a wavelength converted by the phosphor.

In addition, the light-emitting device according to the present invention may be used for various types of lamps, such as a general-purpose bullet-shaped lamp, a side view lamp for a backlight of a portable device, and a top view lamp used for a display device.

For example, as shown in FIG. 4, when the group-III nitride compound semiconductor light-emitting device 1 having electrodes formed on the same surface is mounted to a bullet-shaped lamp, the light-emitting device 1 is bonded to one (a frame 31 in FIG. 4) of two frames. In addition, a negative electrode (see reference numeral 19 in FIG. 3) of the light-emitting device 1 is bonded to a frame 32 by a wire 34, and a positive electrode bonding pad (see reference numeral 18 in FIG. 3) of the light-emitting device 1 is bonded to a frame 31 by a wire 33. Then, the periphery of the light-emitting device 1 is sealed by a mold 35 made of a transparent resin. In this way, it is possible to manufacture a bullet-shaped lamp 3 shown in FIG. 4.

The group-III nitride compound semiconductor light-emitting device according to the present invention can be applied to manufacture, for example, photoelectric conversion devices, such as a laser device and a light-receiving device, and electronic devices, such as an HBT and an HEMT, in addition to the light-emitting device. These semiconductor devices have various known structures, and the laminated structure of the group-III nitride compound semiconductor light-emitting device according to the present invention may include these known device structures.

EXAMPLES

Next, a method of manufacturing the group-III nitride compound semiconductor light-emitting device according to the present invention will be described in detail with reference to Examples, but the present invention is not limited to the Examples.

Example 6

FIG. 1 is a cross-sectional view schematically illustrating the structure of a laminated semiconductor of a group-III nitride compound semiconductor light-emitting device according to Example 6.

In Example 6, an aggregate of columnar crystals made of AlN was formed as the buffer layer 12 on the c-plane of the substrate 11 made of sapphire by an RF sputtering method, and layers made of GaN were formed as the underlying layer 14a and the n-type contact layer 14b on the buffer layer by the RF sputtering method.

A sapphire substrate 11 whose one surface was polished into a mirror surface suitable for epitaxial growth was prepared, and the substrate 11 was put into a sputtering apparatus, without being subjected to a pre-process, such as a wet process. A sputtering apparatus that had a radio frequency power supply and a mechanism capable of changing the position of a magnet in a target was used.

Then, the substrate 11 was heated up to a temperature of 750° C. in the sputtering apparatus and only nitrogen gas was introduced into the sputtering apparatus at a flow rate of 15 sccm to maintain the internal pressure of the chamber at 0.08 Pa. Then, an RF bias of 50 W was applied to the substrate 11 to generate nitrogen plasma, thereby cleaning the surface of the substrate 11.

Then, argon and nitrogen gases were introduced into the sputtering apparatus, and the temperature of the substrate 11 was reduced to 500° C. Then, an RF bias of 0.5 W/cm$^2$ was applied to the substrate 11, and a power of 1 W/cm$^2$ was supplied to an Al target to form the buffer layer 12 made of AlN on the sapphire substrate 11 under the following conditions: an internal pressure of a furnace of 0.5 Pa; a flow rate of Ar gas of 5 sccm; and a flow rate of nitrogen gas of 15 sccm (the percentage of nitrogen in the entire gas was 75%).

The magnet in the target was rotated both during the cleaning of the substrate 11 and during deposition.

An AlN film (buffer layer 12) was formed with a thickness of 50 nm at a predetermined deposition rate (0.12 nm/s) for a predetermined time, and then a plasma operation stopped to reduce the temperature of the substrate 11.

Then, the substrate 11 having the buffer layer 12 formed thereon was taken out from the sputtering apparatus, and then transported to another sputtering apparatus. A sample having a GaN layer (group-III nitride compound semiconductor) was manufactured by a sputtering method as follows. As the sputtering apparatus for forming the GaN layer, an apparatus including a radio frequency power supply and a mechanism for sweeping the magnet in a rectangular Ga target to change the position of a magnetic field was used. In addition, a pipe for supplying a cooling medium was provided in the Ga target, and the sputtering apparatus supplied a cooling medium cooled down to a temperature of 20° C. through the pipe, thereby preventing Ga from being melted due to heat.

First, argon and nitrogen gases were introduced into the chamber, and the temperature of the substrate 11 was heated up to 1,000° C. Then, an RF bias of 0.5 W/cm$^2$ was applied to the substrate 11, and a power of 1 W/cm$^2$ was supplied to the Ga target to form a layer made of GaN (the underlying layer 14a) on the substrate 11 under the following conditions: an internal pressure of a chamber of 0.5 Pa; a flow rate of Ar gas of 5 sccm; and a flow rate of nitrogen gas of 15 sccm (the percentage of nitrogen in the entire gas was 75%). The deposition rate was about 1 nm/s. After a GaN layer having a thickness of 6 μm was formed, plasma generation was stopped.

Then, under the same conditions, a Si-doped GaN layer (n-type contact layer 14b) having an electron concentration of $1 \times 10^{19}$ cm$^{-3}$ and a thickness of 2 μm was formed. The deposition conditions were the same as those when an undoped GaN layer was formed, and ions were radiated from an ion gun onto a Si target provided in the chamber to eject Si particles from the Si target, thereby doping the film with Si.

In this way, the buffer layer 12 that was made of AlN and had a cylindrical structure was formed on the sapphire substrate 11, and an undoped GaN layer (underlying layer 14a) was formed with a thickness of 6 μm on the buffer layer. Then, a Si-doped GaN layer (n-type contact layer 14b) having an electron concentration of $1 \times 10^{19}$ cm$^{-3}$ and a thickness of 2 μm was formed on the undoped GaN layer, thereby manufacturing a sample according to Example 6. The sample had a colorless and transparent front surface.

The X-ray rocking curve (XRC) of the undoped GaN layer (underlying layer 14a) obtained by the above-mentioned method was measured by an X-ray diffractometer (PANalytical's X'pert; four-crystal X-ray diffractometer). In the measuring process, a Cuβ-line X-ray generator was used as a light source and the measurement was performed for (0002) planes, which were symmetric planes, and (10-10) planes, which were asymmetric planes. Generally, in the case of a group-III nitride compound semiconductor, the half width of the XRC spectrum of the (0002) plane is used as an index for the flatness (mosaicity) of crystal and the half width of the XRC spectrum of the (10-10) plane is used as an index for the dislocation density (twist). As a result of the measurement, the (0002) plane of the undoped GaN layer formed by the manufacturing method according to the present invention had a half width of 80 arcseconds and the (10-10) plane thereof had a half width of 250 arcseconds.

Example 7

In Example 7, a Si-doped n-type contact layer 14b was formed on an undoped GaN crystal (underlying layer 14a) which was formed with a thickness of 6 μm under the same conditions as those in Example 6 using the same sputtering apparatus.

Then, the sample was put into an MOCVD furnace, and various layers were formed on the sample. Finally, an epitaxial wafer (laminated semiconductor 10) having an epitaxial layer structure for the group-III nitride compound semiconductor light-emitting device shown in FIG. 1 was manufactured.

The epitaxial wafer had a laminated structure in which the buffer layer 12 that was made of AlN having a cylindrical structure, the underlying layer 14a that was made of undoped GaN with a thickness of 6 μm, the n-type contact layer 14b that had an electron concentration of $1 \times 10^{19}$ cm$^{-3}$ and was made of Si-doped GaN with a thickness of 2 μm, an n-type $In_{0.1}Ga_{0.9}N$ clad layer (n-type clad layer 14c) that had an electron concentration of $1 \times 10^{18}$ cm$^{-3}$ and a thickness of 20 nm, the light-emitting layer 15 (having a multiple quantum well structure), and the p-type semiconductor layer 16 were sequentially formed on the sapphire substrate 11 having the c-plane by the same deposition method as that according to Example 1. The light-emitting layer 15 had a laminated structure in which six GaN barrier layers 15a each having a thickness of 16 nm and five undoped $In_{0.2}Ga_{0.8}N$ well layers 15b each having a thickness of 3 nm were alternately laminated, and two of the GaN barrier layers were arranged at the uppermost and lowermost sides. The p-type semiconductor layer 16 was formed by laminating a Mg-doped p-type $Al_{0.1}Ga_{0.9}N$ clad layer 16a with a thickness of 5 nm and a Mg-doped p-type $Al_{0.02}Ga_{0.98}N$ contact layer 16b with a thickness of 200 nm.

In this way, an epitaxial wafer having an epitaxial layer structure for a semiconductor light-emitting device was manufactured. The Mg-doped p-type $Al_{0.02}Ga_{0.98}N$ contact layer 16b showed p-type characteristics without being subjected to an annealing process for activating p-type carriers.

Then, the epitaxial wafer (see the laminated semiconductor 10 shown in FIG. 1) having the epitaxial layer structure formed on the sapphire substrate 11 was used to manufacture a light-emitting diode (see the light-emitting device 1 shown in FIGS. 2 and 3), which is a kind of semiconductor light-emitting device.

First, the translucent positive electrode 17 made of ITO and the positive electrode bonding pad 18 having a laminated structure of Ti, Al, and Au layers formed in this order on the surface of the translucent positive electrode were sequentially formed on the surface of the Mg-doped p-type $Al_{0.02}Ga_{0.98}N$ contact layer 16b of the wafer by a known photolithography method. Then, dry etching was performed on a portion of the wafer to expose the exposed region 14d from the n-type contact layer 14b. Then, the negative electrode 19 having a four-layer structure of Ni, Al, Ti, and Au layers was formed on the exposed region 14d, thereby forming the electrodes shown in FIGS. 2 and 3 on the wafer.

The rear surface of the substrate 11 of the wafer having electrodes formed on the p-type semiconductor layer and the n-type semiconductor layer was ground and polished into a mirror surface, and then the wafer was cut into individual square chips each having a 350 μm square. Then, the chip was mounted to a lead frame with each electrode facing upward, and then connected to the lead frame by gold wires, thereby obtaining a semiconductor light-emitting device. A forward current of 20 mA was applied between the positive electrode bonding pad 18 and the negative electrode 19 of the semiconductor light-emitting device (light-emitting diode) to measure a forward voltage. As a result, the forward voltage was 3.0 V. In addition, the emission state was observed through the p-side translucent positive electrode 17. As a result, the emission wavelength was 470 nm and the emission power was 15 mW. The emission characteristics of the light-emitting diode were obtained from substantially the entire surface of the manufactured wafer, without any variation.

In Example 7, it took 8 hours to perform all of the above-mentioned deposition processes.

Comparative Example 1

In Comparative Example 1, an underlying layer 14a and an n-type contact layer 14b were formed by sputtering under the same conditions as those in Examples 6 and 7 except that an aggregate of columnar crystals made of AlN was formed as a buffer layer on the c-plane of a substrate made of sapphire at a substrate temperature of 700° C. using a rotary-cathode-type RF sputtering apparatus, only a nitrogen gas was supplied into a chamber, and an underlying layer was formed at a substrate temperature of 900° C. Then, the wafer was taken out from a reactor, and it was visually observed that the front surface of the wafer was a mirror surface.

Then, a light-emitting device semiconductor laminated structure was formed on the n-type contact layer 14b by MOCVD under the same conditions as those in Example 7.

Then, a light-emitting diode chip was obtained from the manufactured wafer by the same method as that in Example 2. A forward current of 20 mA was applied between electrodes to measure a forward voltage. As a result, the forward voltage was 3.5 V. In addition, the emission state was observed through the p-side translucent positive electrode. As a result, the emission wavelength was 470 nm and emission power was 9 mW. The emission characteristics of the light-emitting diode were obtained from substantially the entire surface of the manufactured wafer, without any variation.

However, in Comparative Example 1, it was found that the deposition rate was about one third of that of Example 6. In addition, in Comparative Example 1, it took 14 hours to perform all of the above-mentioned deposition processes, which is longer than the process time in Example 7.

Comparative Example 2

In Comparative Example 2, an underlying layer 14a and an n-type contact layer 14b were formed on a buffer layer 12 by sputtering under the same conditions as those in Examples 6 and 7 except that the internal pressure of a chamber of a sputtering apparatus was set to 15 Pa. Then, the wafer was taken out from a reactor, and it was observed that the front surface of the wafer became clouded. As a result, it was difficult to form a light-emitting device structure.

Comparative Example 3

In Comparative Example 3, an underlying layer 14a and an n-type contact layer 14b were formed on a buffer layer 12 by sputtering under the same conditions as those in Examples 6 and 7 except that the temperature of the substrate 11 was 200° C. Then, the wafer was taken out from a reactor, and it was observed that the front surface of the wafer became clouded. As a result, it was difficult to form a light-emitting device structure.

Comparative Example 4

In Comparative Example 4, an underlying layer 14a and an n-type contact layer 14b were formed on a buffer layer 12 by sputtering under the same conditions as those in Examples 6 and 7 except that the deposition rate was set to 20 nm/sec. Then, the wafer was taken out from a reactor, and it was observed that the front surface of the wafer became clouded. As a result, it was difficult to form a light-emitting device structure.

Example 8

In Example 8, an aggregate of columnar crystals of GaN was formed as a buffer layer on a ZnO (0001) substrate by an RF magnetron sputtering method, and a Ge-doped AlGaN underlying layer was formed on the buffer layer using the same sputtering apparatus as that used in Example 6. Then, a Si-doped n-type AlGaN contact layer was formed on the underlying layer. Then, the same light-emitting device semiconductor laminated structure as that in Example 7 was formed on the n-contact layer by MOCVD. In this case, the content of Al in the underlying layer was 10%. In addition, when the buffer layer was sputtered, the temperature of the substrate was a room temperature, and when the underlying layer was formed, the temperature of the substrate was 750° C. In this example, the amount of In raw material included in the light-emitting layer was increased in order to manufacture a green LED emitting light in a wavelength of about 525 nm.

In Example 8, after the light-emitting device semiconductor laminated structure was formed, the wafer was taken out from a reactor, and it was found that the front surface of the wafer was a mirror surface.

Then, a light-emitting diode chip was obtained from the manufactured wafer by the same method as that in Example 7. A forward current of 20 mA was applied between electrodes to measure a forward voltage. As a result, the forward voltage was 3.0 V. In addition, the emission state was observed through the p-side translucent positive electrode. As a result, the emission wavelength was 525 nm and the emission power was 8 mW. The emission characteristics of the light-emitting diode were obtained from substantially the entire surface of the manufactured wafer, without any variation.

The above-mentioned results prove that the group-III nitride compound semiconductor light-emitting device according to the present invention has high productivity and good emission characteristics.

Industrial Applicability

The group-III nitride compound semiconductor light-emitting device according to the present invention includes an outer layer made of a group-III nitride compound semiconductor crystal having high crystallinity.

Therefore, it is possible to manufacture a semiconductor light-emitting device having good emission characteristics, such as a light-emitting diode, a laser diode, or an electronic device.

The invention claimed is:

1. A method of manufacturing a group-III nitride compound semiconductor light-emitting device, comprising:
a step of forming on a substrate a semiconductor layer made of a group-III nitride compound semiconductor including Ga as a group-III element using a sputtering method,
wherein the substrate and a sputtering target are arranged so as to face each other, and
a gap between the substrate and the sputtering target is in the range of 20 to 100 mm, and
when the semiconductor layer is formed by the sputtering method, an RF bias of not less than 0.1 W/cm$^2$ is applied to the substrate.

2. The method of manufacturing a group-III nitride compound semiconductor light-emitting device according to claim 1,
wherein the semiconductor layer is formed by a reactive sputtering method that introduces a nitride raw material into a reactor.

3. The method of manufacturing a group-III nitride compound semiconductor light-emitting device according to claim 2,
wherein nitrogen is used as the nitride raw material.

4. The method of manufacturing a group-III nitride compound semiconductor light-emitting device according to claim 1,
wherein a buffer layer made of a columnar crystal is formed between the substrate and the semiconductor layer.

5. The method of manufacturing a group-III nitride compound semiconductor light-emitting device according to claim 4,
wherein the buffer layer is formed by the sputtering method.

6. The method of manufacturing a group-III nitride compound semiconductor light-emitting device according to claim 4,
wherein the buffer layer is formed of a group-III nitride compound including Al as a group-III element.

7. The method of manufacturing a group-III nitride compound semiconductor light-emitting device according to claim 6,
wherein the buffer layer is formed of AlN.

8. The method of manufacturing a group-III nitride compound semiconductor light-emitting device according to claim 4,
wherein the buffer layer is formed so as to cover 90% or more of the front surface of the substrate.

9. The method of manufacturing a group-III nitride compound semiconductor light-emitting device according to claim 4,
wherein the width of the columnar crystal forming the buffer layer is in the range of 0.1 to 100 nm.

10. The method of manufacturing a group-III nitride compound semiconductor light-emitting device according to claim 4,
wherein the thickness of the buffer layer is in the range of 10 to 500 nm.

11. The method of manufacturing a group-III nitride compound semiconductor light-emitting device according to claim 4, wherein the buffer layer is formed of AlN, and the semiconductor layer made of the group-III nitride compound is formed of GaN.

12. The method of manufacturing a group-III nitride compound semiconductor light-emitting device according to claim 1,
wherein the substrate is formed of sapphire.

13. A group-III nitride compound semiconductor light-emitting device manufactured by the manufacturing method according to claim 1.

14. A lamp comprising the group-III nitride compound semiconductor light-emitting device according to claim 13.

* * * * *